US008879318B2

(12) United States Patent
Ahn et al.

(10) Patent No.: US 8,879,318 B2
(45) Date of Patent: Nov. 4, 2014

(54) METHOD OF STORING DATA IN NONVOLATILE MEMORY DEVICE AND METHOD OF OPERATING NONVOLATILE MEMORY DEVICE

(75) Inventors: Jung-Ro Ahn, Suwon-si (KR); Bong-Yong Lee, Suwon-si (KR); Hae-Bum Lee, Suwon-si (KR); Eui-Do Kim, Ansan-si (KR); Houng-Kuk Jang, Hwaseong-si (KR); Kyung-Jun Shin, Hwaseong-si (KR); Tae-Hyun Yoon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 167 days.

(21) Appl. No.: 13/545,127

(22) Filed: Jul. 10, 2012

(65) Prior Publication Data
US 2013/0016558 A1    Jan. 17, 2013

(30) Foreign Application Priority Data

Jul. 12, 2011    (KR) ........................ 10-2011-0068743

(51) Int. Cl.
*G11C 16/04*    (2006.01)
*G11C 16/34*    (2006.01)

(52) U.S. Cl.
CPC ........ *G11C 16/3459* (2013.01); *G11C 16/0483* (2013.01)
USPC ............ 365/185.03; 365/185.19; 365/185.28; 365/185.25; 365/185.22

(58) Field of Classification Search
USPC ............. 365/185.03, 185.19, 185.28, 185.25, 365/185.22, 185.14, 185.18, 185.27, 185.29
See application file for complete search history.

(56) References Cited

U.S. PATENT DOCUMENTS

| 6,246,612 B1* | 6/2001 | Van Houdt et al. ...... 365/185.29 |
| 2008/0094910 A1* | 4/2008 | Sim .......................... 365/185.22 |
| 2011/0080791 A1* | 4/2011 | Kim et al. ................ 365/185.22 |

FOREIGN PATENT DOCUMENTS

| JP | 2007-141367 | 6/2007 |
| KR | 1020090002614 A | 1/2009 |
| KR | 1020100027782 A | 3/2010 |

* cited by examiner

*Primary Examiner* — Richard Elms
*Assistant Examiner* — Mohammed A Bashar
(74) *Attorney, Agent, or Firm* — Volentine & Whitt, PLLC

(57) ABSTRACT

In a method of storing data in a nonvolatile memory device, a program operation is performed on target memory cells among a plurality of memory cells based on a program voltage. A verification operation is performed on the target memory cells based on a verification voltage to determine whether all of the target memory cells are completely programmed. The verification voltage is changed depending on the program operation.

14 Claims, 25 Drawing Sheets

100a

FIRST DIRECTION
THIRD DIRECTION
SECOND DIRECTION

METHOD OF STORING DATA IN NONVOLATILE MEMORY DEVICE AND METHOD OF OPERATING NONVOLATILE MEMORY DEVICE

CROSS-REFERENCE TO RELATED APPLICATION

A claim of priority under 35 USC §119 is made to Korean Patent Application No. 2011-0068743, filed on Jul. 12, 2011 in the Korean Intellectual Property Office (KIPO), the contents of which are herein incorporated by reference in their entirety.

BACKGROUND

Example embodiments relate to semiconductor memory devices, and more particularly, to methods of storing data in nonvolatile memory devices and methods of operating nonvolatile memory devices.

Semiconductor memory devices can be roughly divided into two categories depending upon whether they retain stored data when disconnected from power. These categories include volatile memory devices, which lose stored data when disconnected from power, and nonvolatile memory devices, which retain stored data when disconnected from power.

Nonvolatile memory devices are generally operable in a program mode in which a program (write) operation is performed, a read mode to in which a read operation is performed, and an erase mode in which an erase operation is performed. In addition, nonvolatile memory devices may further be operative in a verification mode in which a read verification operation is executed to verify that data is properly written in a program operation. The verification mode may be executed as part of the program mode.

SUMMARY

In a method of storing data in a nonvolatile memory device according to some example embodiments, a program operation is performed on target memory cells among a plurality of memory cells based on a program voltage. A verification operation is performed on the target memory cells based on a verification voltage to determine whether all of the target memory cells are completely programmed. The verification voltage is changed depending on the program operation.

A level of the verification voltage may be decreased depending on the program operation.

A program loop including the program operation and the verification operation may be repeatedly performed when it is determined that at least one of the target memory cells corresponds to a failed program state. The method of storing data may be terminated if it is determined that all of the target memory cells correspond to normal program states.

A next level of the verification voltage in a next program loop may be lower by a step down level than a current level of the verification voltage in a current program loop when the program loop is repeatedly performed.

The next level of the verification voltage may be substantially the same as the current level of the verification voltage when the current level of the verification voltage corresponds to a predetermined reference level.

A next level of the verification voltage in a next program loop may be lower than or substantially the same as a current level of the verification voltage in a current program loop when the program loop is repeatedly performed.

The verification operation may be performed by applying the verification voltage to a wordline connected to the target memory cells, generating verification result by comparing threshold voltages of the target memory cells with the verification voltage, determining whether each target memory cell corresponds to a failed program state or a normal program state based on the verification result, and adjusting a level of the verification voltage when it is determined that at least one of the target memory cells corresponds to the failed program state.

The verification operation may be performed by selectively further applying a bulk voltage to a bulk substrate of the nonvolatile memory device including the target memory cells. The bulk voltage may be a negative voltage.

A pre-program operation may be further performed on the target memory cells. An erase operation may be further performed on the target memory cells after the pre-program operation. The program operation may be a post-program operation that is performed after the erase operation.

The nonvolatile memory device may be a vertical memory device having a stacked structure.

The plurality of memory cells may include single-level memory cells or multi-level memory cells. Each single-level memory cell may store a single data bit. Each multi-level memory cell may store a plurality of data bits.

In a method of operating a nonvolatile memory device according to some example embodiments, a program operation is performed on target memory cells among a plurality of memory cells based on a program voltage. A verification operation is performed on the target memory cells based on a verification voltage to determine whether all of the target memory cells are completely programmed. The verification voltage is changed depending on the program operation. A final verification level of the verification voltage is provided to an external control circuit. The final verification level of the verification voltage is determined based on a result of the verification operation.

A read voltage may be further set based on the final verification level of the verification voltage. A read operation may be performed on the target memory cells based on the read voltage.

The program operation and the verification operation may be repeatedly performed based on the result of the verification operation.

In a method of storing data in a nonvolatile memory device according to some example embodiments, an operational loop is executed which includes (a) programming memory cells of the nonvolatile memory device, (b) determining a pass/fail condition of a programming state of the programmed target memory cells by applying a verification voltage to the programmed target memory cells, and (c) adjusting the verification voltage when a fail condition is determined. The operational loop is repeatedly executed using the adjusted verification voltage until a pass condition is determined.

Adjusting the verification voltage may include reducing the verification voltage by a step down level, and the step down level may be the same for each operational loop, or variable for each operational loop.

Determining the pass/fail condition may include applying the verification voltage to a wordline connected to the target memory cells, generating verification result by comparing threshold voltages of the target memory cells with the verification voltage, and determining whether each target memory cell corresponds to the pass condition or the fail condition based on the verification result.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Figure 1:
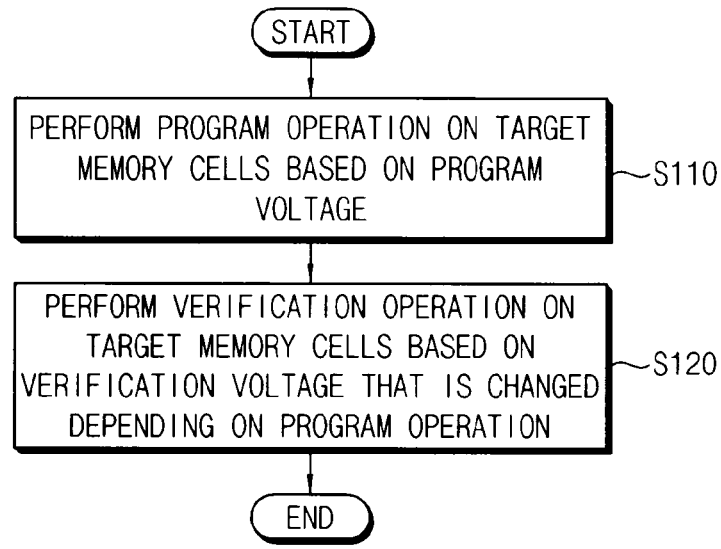
FIG. 1 is a flowchart illustrating a method of storing data in a nonvolatile memory device according to some example embodiments.

Various example embodiments will be described more fully with reference to the accompanying drawings, in which embodiments are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art Like reference numerals refer to like elements throughout this application.

It will be understood that, although the terms first, second, and so on may be used herein to describe various elements, these elements should not be limited by these terms. These terms are used to distinguish one element from another. For example, a first element could be termed a second element, and, similarly, a second element could be termed a first element, without departing from the scope of the inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," and so on.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a flowchart illustrating a method of storing data in a nonvolatile memory device according to some example embodiments.

The method illustrated in FIG. 1 may be applied in a nonvolatile memory device performing a writing operation in which a threshold voltage of a memory cell in the nonvolatile memory device is programmed by applying a predetermined voltage to the memory cell. Hereinafter, the method of storing data in the nonvolatile memory device according to example embodiments will be described with reference to a flash memory device. However, the method of storing data in a nonvolatile memory device according to example embodiments may be applied to other types of nonvolatile memory devices, such as a phase change random access memory (PRAM), a resistance random access memory (RRAM), a magnetic random access memory (MRAM), a ferroelectric random access memory (FRAM), and others. Detailed example configurations of the flash memory device and a memory cell array included in the flash memory device will be described later with reference to FIGS. 2, 3A, 3B, 3C, 3D, 3E and 3F.

Referring to FIG. 1, in a method of storing data in a nonvolatile memory device, a program operation is performed on target memory cells among a plurality of memory cells based on a program voltage (step S110). For example, in the flash memory device, the program operation may be performed such that a threshold voltage is programmed by applying predetermined voltages to a selected wordline and each of bitlines. The program voltage may be commonly applied to the selected wordline. The target memory cells which are to be programmed may be selected by applying a program permission voltage or a program inhibition voltage to each of the bitlines based on write data.

After the program operation, a verification operation is performed on the target memory cells based on a verification voltage to determine whether all of the target memory cells are completely programmed (step S120). The verification voltage is changed depending on the program operation. For example, a level of the verification voltage may be decreased depending on the program operation. If the level of the verification voltage is decreased to a predetermined reference level, the level of the verification voltage may not be decreased and may be maintained at the predetermined reference level. This will be explained in greater detail later herein.

In an example embodiment, the program operation and the verification operation may form a single program loop. The program loop may be selectively repeated. For example, if it is determined that at least one of the target memory cells corresponds to a failed program state based on the verification result, the program loop may be repeatedly performed. If it is determined that all of the target memory cells correspond to normal program states based on the verification result, the method of storing data may be terminated. When the program loop is repeatedly performed, a next level of the verification voltage in a next program loop may be lower than or substantially the same as a current level of the verification voltage in a current program loop. Example embodiments of changing the verification voltage will be described later with reference to FIGS. 4 through 13.

As a scale of nonvolatile memory devices is reduced, random telegraph noise (RTN) may degrade the reliability of a verification operation. In addition, as a program loop including a program operation and the verification operation is repeatedly performed, an endurance of the nonvolatile memory devices may be degraded and the reliability of the verification operation in the nonvolatile memory devices may be degraded. To effectively perform the verification operation, a method of increasing a program voltage applied to a wordline of target memory cells and/or a method of increasing a program permission voltage applied to bitlines of the target memory cells have been proposed, but conventional methods can not assure threshold voltage distribution characteristics for target memory cells.

In the method of storing data in the nonvolatile memory device according to some example embodiments, the verification operation is performed based on the verification voltage that is changed depending on the program operation. For example, as the program loop is repeatedly performed, the level of the verification voltage may be decreased. Thus, in the nonvolatile memory device using the method of FIG. 1, the number of repeated program loops may be reduced, programming time and verifying time may be reduced without degrading a characteristic of threshold voltage distributions for the target memory cells, and data may be effectively stored in the target memory cells. The nonvolatile memory device may be effectively tested in a manufacturing process such as an electric die sorting (EDS) process and/or a package process by using the method of FIG. 1, and productivity of the nonvolatile memory device may be increased.

Hereinafter, the method of storing data in the nonvolatile memory device according to some example embodiments will be explained in detail with reference to example configurations of the flash memory device and the memory cell array.

Figure 2:
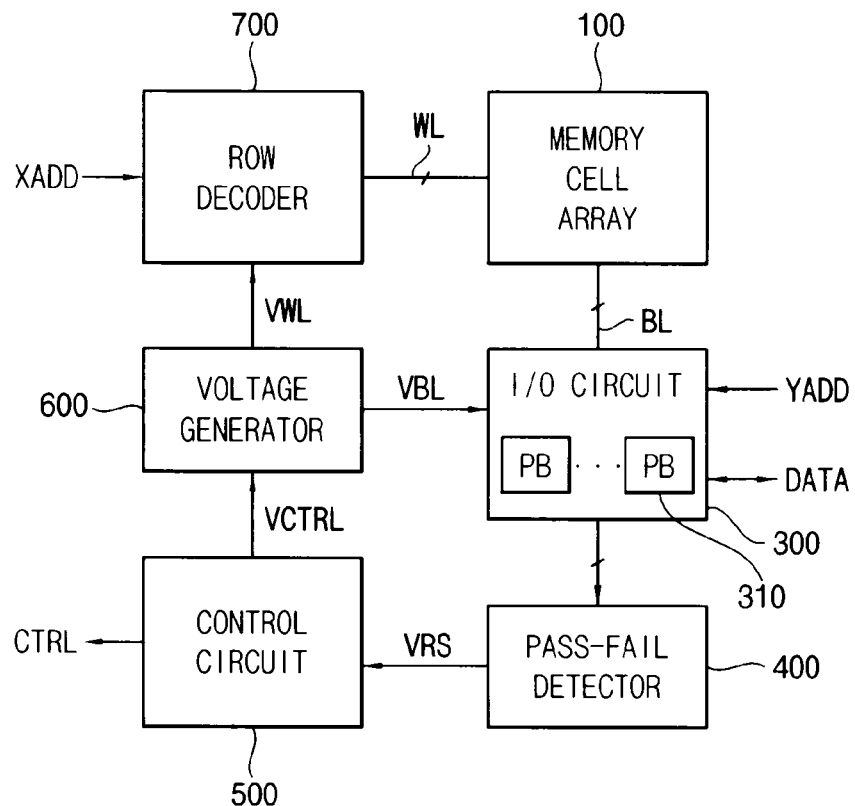
FIG. 2 is a block diagram illustrating an example of a nonvolatile memory device for use in describing the method of FIG. 1.

FIG. 2 is a block diagram illustrating a nonvolatile memory device for describing the method of FIG. 1.

Referring to FIG. 2, a nonvolatile memory device 10 includes a memory cell array 100, a row decoder 700, an input/output (I/O) circuit 300, a pass-fail detector 400, a control circuit 500, and a voltage generator 600. The nonvolatile memory device 10 may be a flash memory device.

The memory cell array 100 includes a plurality of memory cells each of which is connected to a respective one of wordlines WL and a respective one of bitlines BL. As will be described below with reference to FIGS. 3A, 3B, 3C, 3D, 3E and 3F, the plurality of memory cells may include NAND flash memory cells or NOR flash memory cells, and may be arranged in a two-dimensional (2-D) array structure or a three-dimensional (3-D) vertical array structure (e.g., a vertical memory device having a stacked structure).

In an example embodiment, the plurality of memory cells may include either of single-level memory cells (SLC) in which only one bit is stored in each memory cell, or multi-level memory cells (MLC) in which more than two bits are stored in each memory cell. In the MLC, the memory cells may be programmed using various program methods, such as a shadow programming scheme, a reprogramming scheme or an on-chip buffered programming scheme.

The row decoder 200 selects a wordline based on a row address XADD and consequently, a plurality of memory cells connected to the selected wordline are selected. In a program mode, a program voltage and a verification voltage may be sequentially applied to the selected wordline. In a read mode, a read voltage may be applied to the selected wordline. In an erase mode, an erase voltage may be applied to the selected wordline. Such wordline voltage VWL (e.g., the program voltage, the verification voltage, the read voltage, the erase voltage, and so on.) applied to the wordlines WL may be generated by the voltage generator 600 in response to a voltage control signal VCTRL provided from the control circuit 500.

The I/O circuit 300 is connected to the bitlines BL, and stores data to be written in the memory cell array 100 or data read out from the memory cell array 100. The I/O circuit 300 may include a plurality of page buffers 310 each of which is disposed corresponding to a respective one of the bitlines BL and includes a plurality of data latches. The I/O circuit 300 may operate as a sense amplifier or a write driver depending on the operation modes. For example, the I/O circuit 300 may operate as the sense amplifier during the read mode, and may operate as the write driver during the program mode. The I/O circuit 300 may further provide a function of a column decoder that selects the bitlines BL based on a column address YADD.

The I/O circuit 300 performs the program operation, a reading operation and an erase operation in response to a control signal CTRL provided from the control circuit 500. In the program mode, the I/O circuit 300 may load data provided from an external device and may apply the program permission voltage or the program inhibition voltage to each of bitlines BL based on the write data. As such, the target memory cells which are currently to be programmed may correspond to the memory cells that are coupled to the selected wordline and the bitlines to which the program permission voltage is applied. The verification operation may be performed after programming the target memory cells to determine whether the target memory cells are successfully programmed. The verification operation may be performed by applying the verification voltage to the selected wordline such that the verification voltage is changed depending on the program operation. Such program and verification operations may be repeated until a target state is completely programmed. In the read mode, the I/O circuit 300 may output read data by detecting voltages of bitlines BL. Operations of the I/O circuit 300 in the erase mode may be similar to the operations of the I/O circuit 300 in the program mode.

The pass-fail detector 400 generates a detection signal VRS which indicates whether at least one of the target memory cells corresponds to the failed program state or all of the target memory cells correspond to the normal program states.

The control circuit 500 generates the control signal CTRL for controlling overall operation of the nonvolatile memory device 10 and the voltage control signal VCTRL for controlling the voltage generator 600. For example, the voltage control signal VCTRL may include information about controlling a change timing of the verification voltage, an initial level, a final level, and a change level of the verification voltage, and so on. For another example, as will be described below with reference to FIG. 17, when the read voltage is set based on the final level of the verification voltage, the voltage control signal VCTRL may further include information about controlling the read voltage. For still another example, as will be described below with reference to FIG. 12, when the nonvolatile memory device 10 performs the program operation using incremental step pulse programming (ISPP), the voltage control signal VCTRL may further include information about controlling the number of pulses, a generation timing of pulses, and a level of a start pulse. The control circuit 500 may determine whether programming is completed with respect to the target memory cells based on the detection signal VRS.

The voltage generator 600 generates the wordline voltage VWL and a bitline voltage VBL in response to the voltage control signal VCTRL. The wordline voltage VWL applied to the row decoder 700 may include the program voltage, the verification voltage, the read voltage, and the erase voltage. The bitline voltage VBL applied to the I/O circuit 300 may include the program permission voltage, the program inhibition voltage, and a precharge voltage.

FIGS. 3A, 3B, 3C, 3D, 3E and 3F are diagrams illustrating examples of a memory cell array included in the nonvolatile memory device of FIG. 2.

Figure 3A:
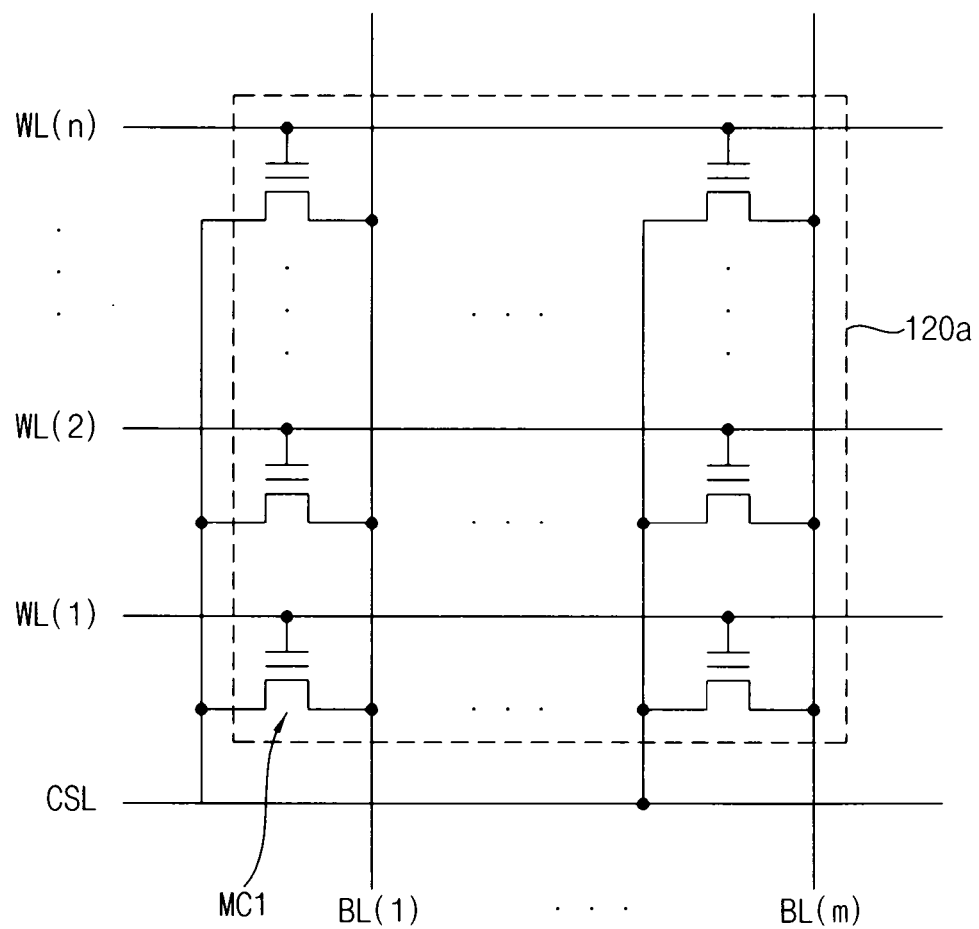
FIGS. 3A, 3B, 3C, 3D, 3E and 3F are diagrams illustrating examples of a memory cell array included in the nonvolatile memory device of FIG. 2.
Figure 3B:
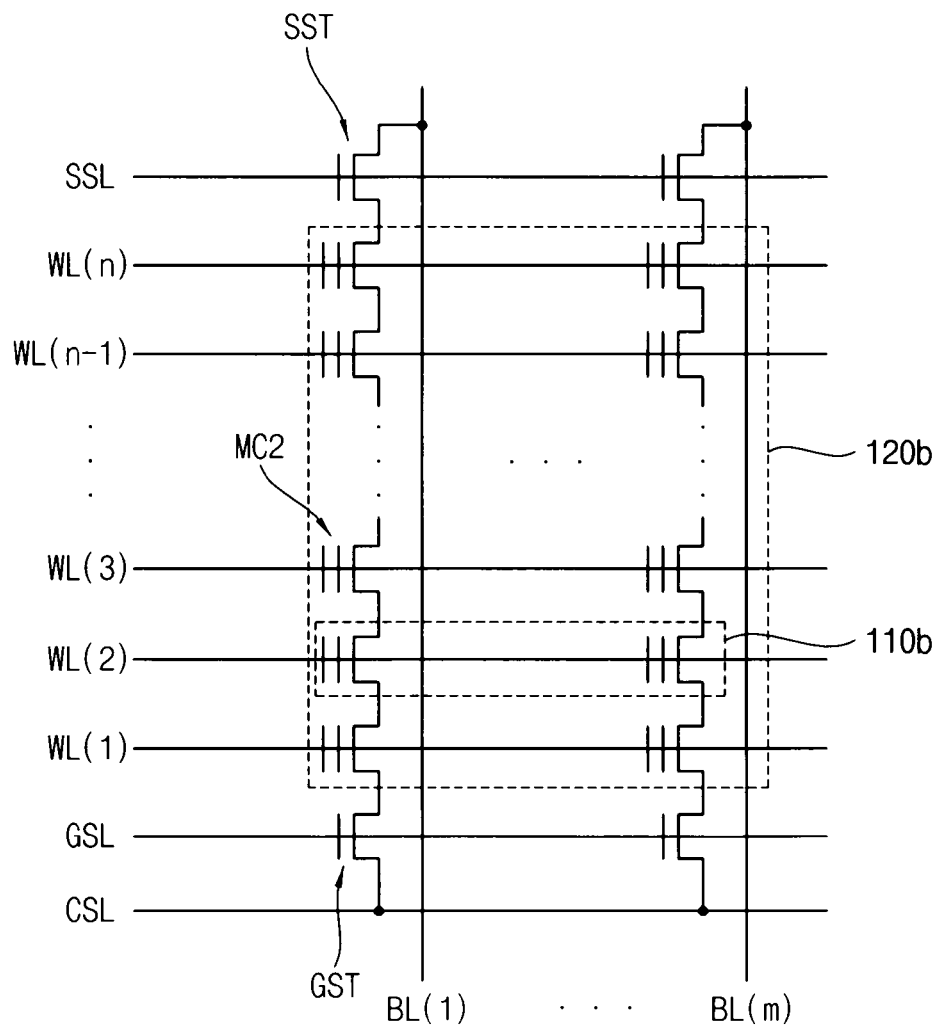
Figure 3C:
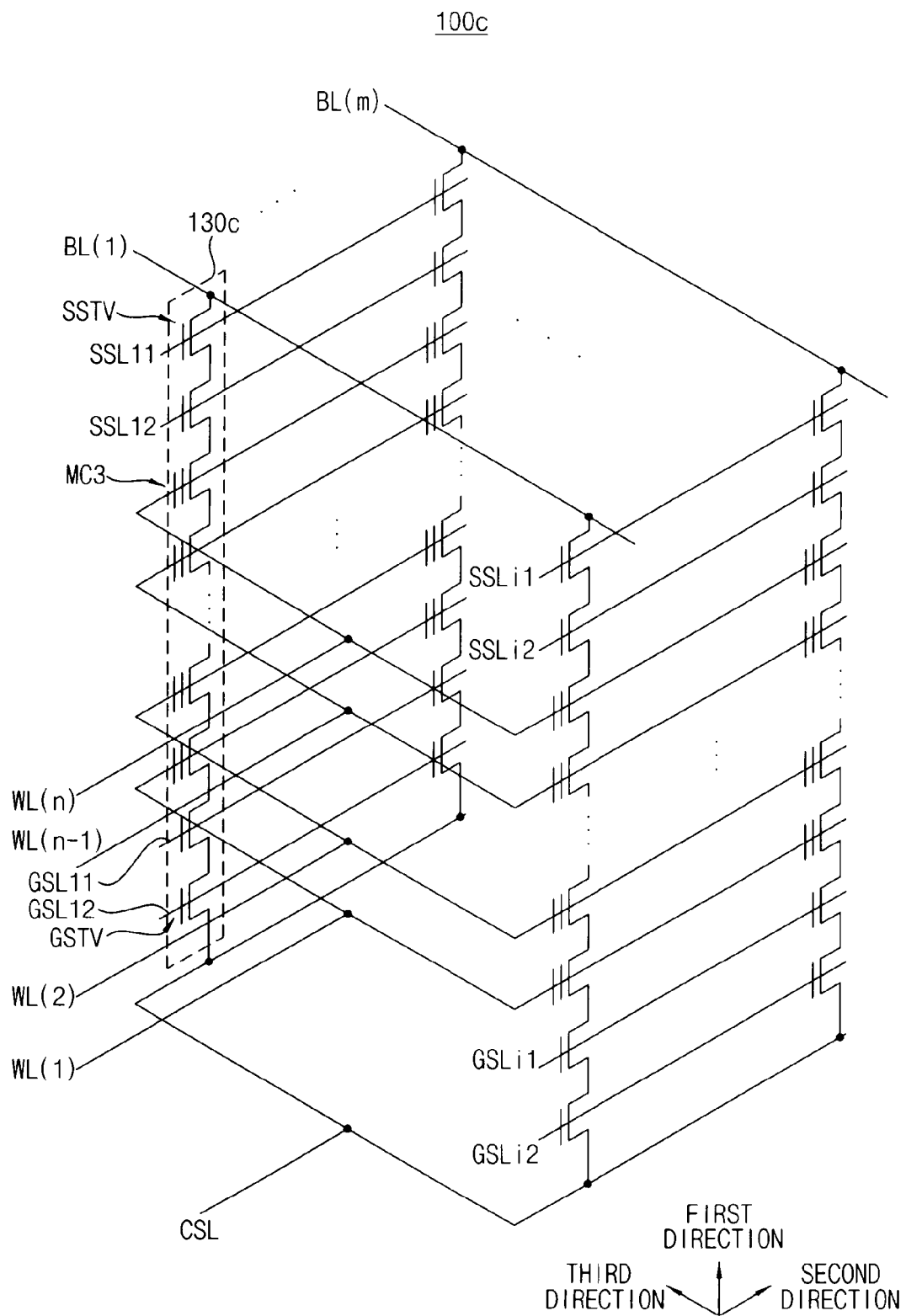
Figure 3D:
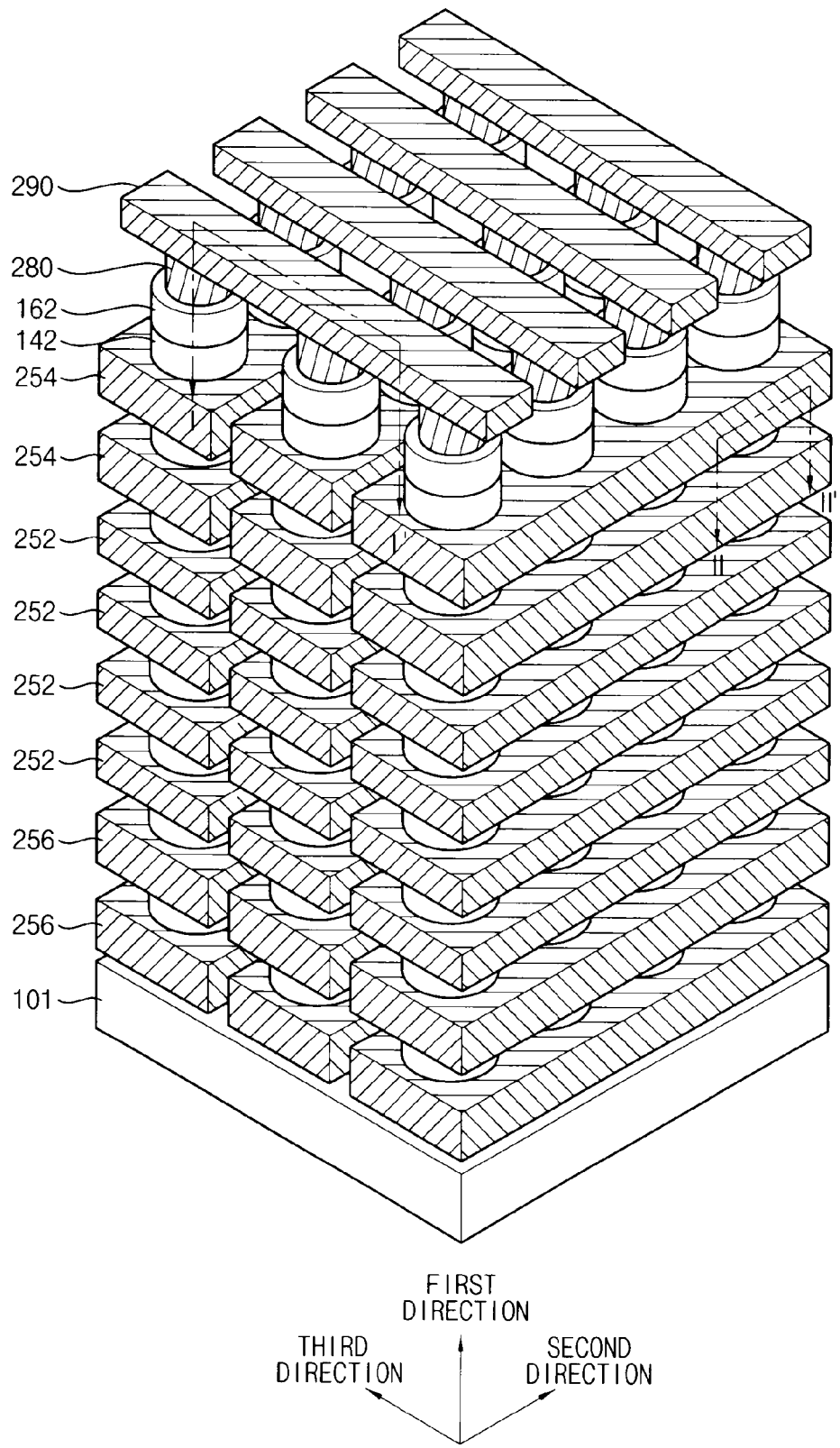
Figure 3E:
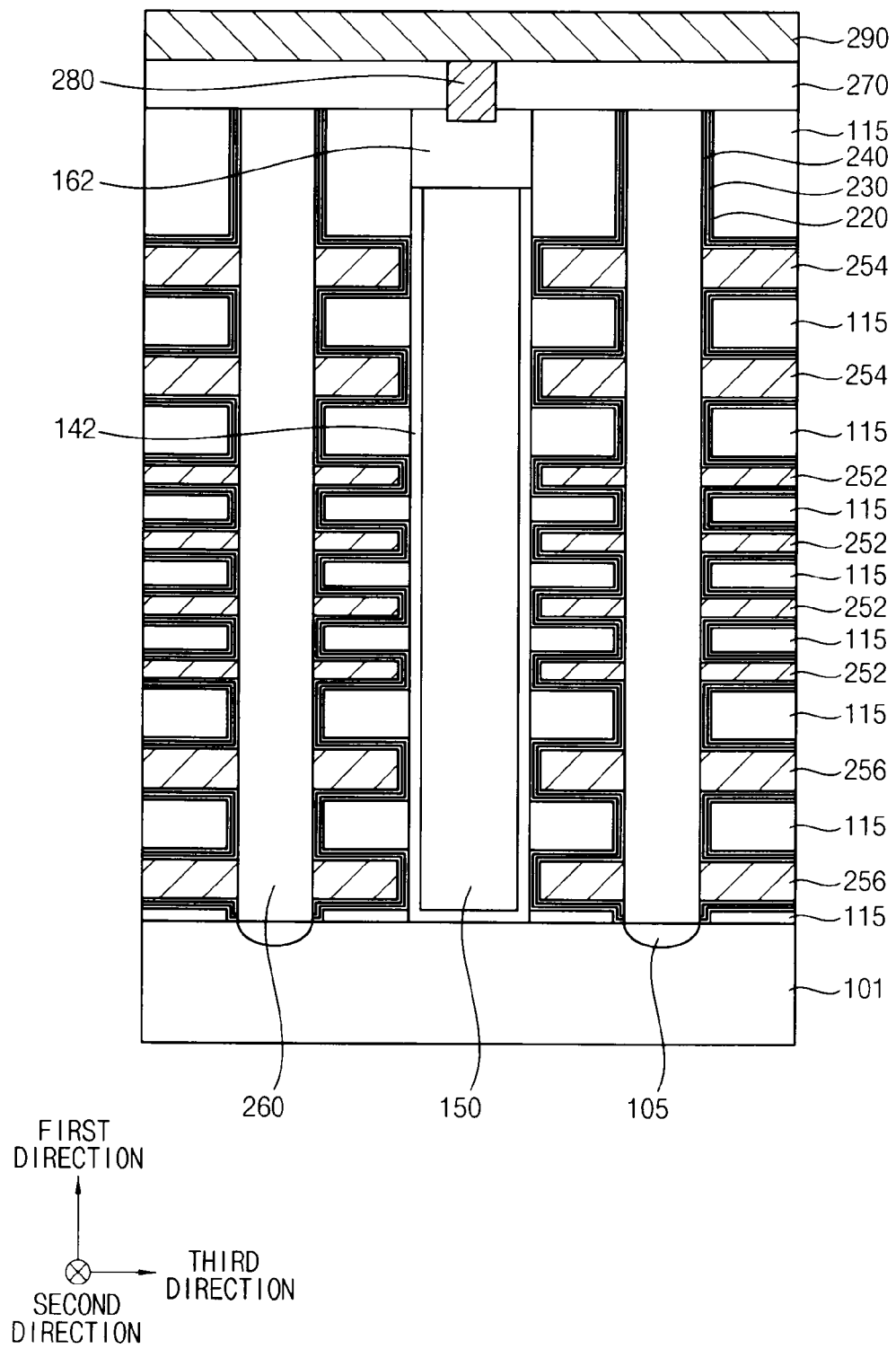
Figure 3F:
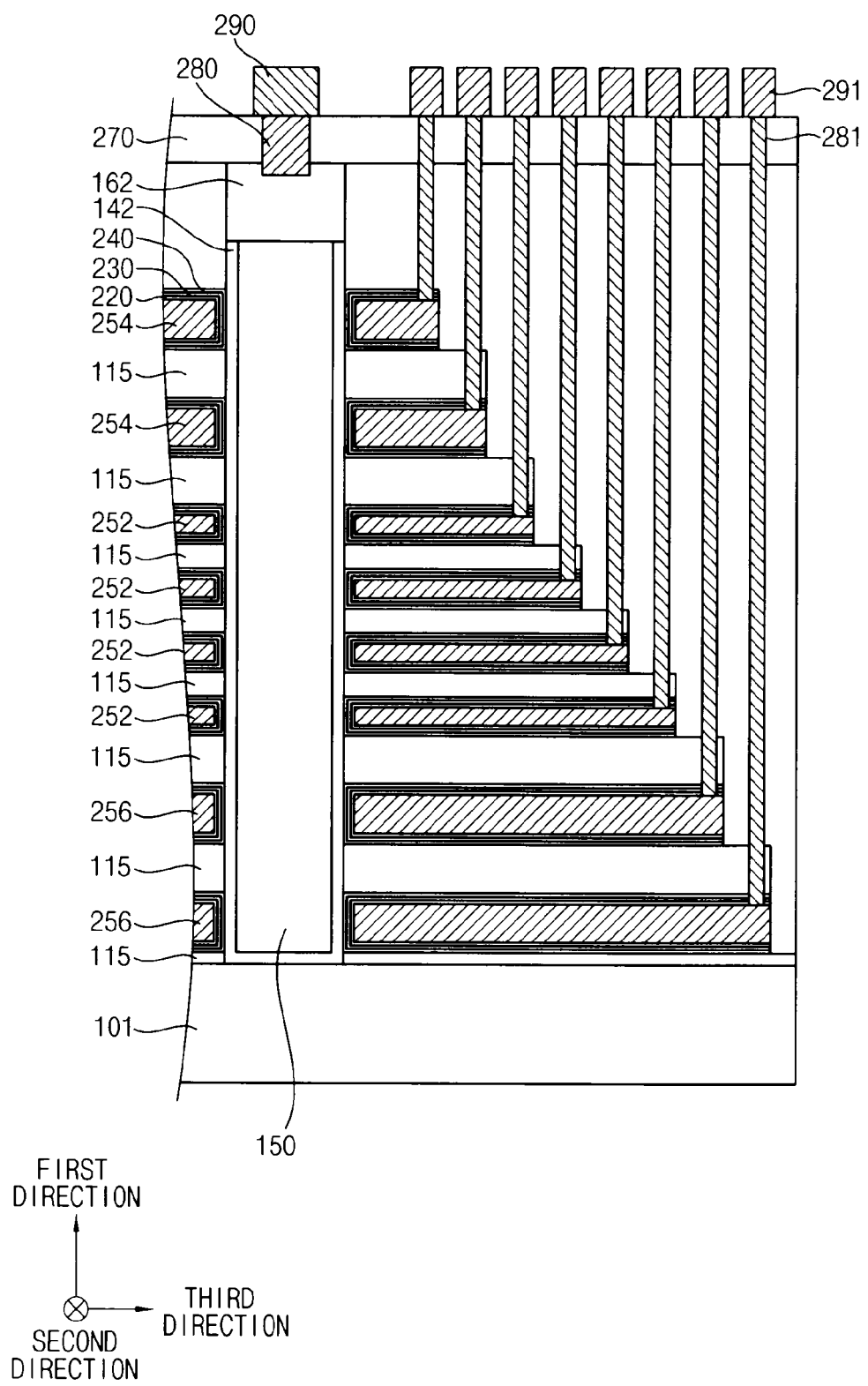

FIG. 3A is a circuit diagram illustrating a memory cell array included in a NOR flash memory device. FIG. 3B is a circuit diagram illustrating a memory cell array included in a NAND flash memory device. FIG. 3C is a circuit diagram illustrating a memory cell array included in a vertical flash memory device. FIG. 3D is a perspective diagram for describing the vertical flash memory device. FIG. 3E is a cross-sectional view of the vertical flash memory device along line I-I' of FIG. 3D. FIG. 3F is a cross-sectional view of the vertical flash memory device along line II-II' of FIG. 3D.

Referring to FIG. 3A, a memory cell array 100a may include a plurality of memory cells MC1. Memory cells in the same column may be connected in parallel between one of bitlines BL(1), . . . , BL(m) and a common source line CSL. Memory cells in the same row may be commonly connected to the same wordline among wordlines WL(1), . . . , WL(n). For example, memory cells in a first column may be connected in parallel between a first bitline BL(1) and the common source line CSL. Memory cells in a first row may be commonly connected to a first wordline WL(1). The memory cells MC1 may be controlled by a voltage on the wordlines WL(1), . . . , WL(n).

In the NOR flash memory device including the memory cell array 100a, a read operation and a program operation may be performed per byte or word, and an erase operation may be performed per block 120a. In the program operation, a bulk voltage having a range of about −0.1 to −0.7 volts may be applied to a bulk substrate of the NOR flash memory device.

Referring to FIG. 3B, the memory cell array 100b may include string select transistors SST, ground select transistors GST and a plurality of memory cells MC2. The string select transistors SST may be connected to bitlines BL(1), . . . , BL(m), and the ground select transistors GST may be connected to a common source line CSL. The memory cells MC2 may be connected in series between the string select transistors SST and the ground select transistors GST. Memory cells in the same row may be connected to the same wordline among wordlines WL(1), . . . , WL(n). For example, 16, 32 or 64 wordlines may be disposed between a string select line SSL and a ground select line GSL.

The string select transistors SST may be connected to the string select line SSL, and may be controlled by a voltage on the string select line SSL. The ground select transistors GST may be connected to the ground select line GSL, and may be controlled by a voltage on the ground select line GSL. The memory cells MC2 may be controlled by a voltage on the wordlines WL(1), . . . , WL(n).

In the NAND flash memory device including the memory cell array 100b, a read operation and a program operation may be performed per page 110b, and an erase operation may be performed per block 120b. In the program operation, a bulk voltage having a level of about 0 volt may be applied to a bulk substrate of the NAND flash memory device. According to example embodiments, each page buffer 310 of FIG. 2 may be connected to an odd-numbered bitline and an even-numbered bitline. In this case, the odd-numbered bitlines may form odd-numbered pages, the even-numbered bitlines may form even-numbered pages, and program operations for the odd-numbered pages and the even-numbered pages may be alternately performed.

Referring to FIG. 3C, a memory cell array 100c may include a plurality of strings 130c each of which has a vertical structure. The plurality of strings 130c may be formed in a second direction to define a string column, and a plurality of string columns may be formed in a third direction to define a string array. Each string may include string select transistors SSTV, ground select transistors GSTV, and a plurality of memory cells MC3 that are formed in a first direction and are connected in series between the string select transistors SSTV and the ground select transistors GSTV.

The string select transistors SSTV may be connected to bitlines BL(1), . . . , BL(m), and the ground select transistors GST may be connected to a common source line CSL. The string select transistors SSTV may be connected to string select lines SSL11, SSL12, . . . , SSLi1, SSLi2, and the ground select transistors GSTV may be connected to ground select lines GSL11, GSL12, . . . , GSLi1, GSLi2. The memory cells in the same layer may be connected to the same wordline among wordlines WL(1), WL(2), . . . WL(n−1), WL(n). Each string select line and each ground select line may extend in the second direction, and the string select lines SSL11, . . . , SSLi2 and the ground select lines GSL11, . . . , GSLi2 may be formed in the third direction. Each wordline may extend in the second direction, and the wordlines WL(1), . . . , WL(n) may be formed in the first direction and the third direction. Each bitline may extend in the third direction, and the bitlines BL(1), . . . , BL(m) may be formed in the second direction. The memory cells MC3 may be controlled by a voltage on the wordlines WL(1), . . . , WL(n).

Similarly to the NAND flash memory device, in the vertical flash memory device including the memory cell array 100c, a read operation and a program operation may be performed per page, and an erase operation may be performed per block.

Although not illustrated in FIG. 3C, according to example embodiments, two string select transistors included in a single string may be connected to a single string select line, and two ground select transistors included in the single string may be connected to a single ground select line. According to example embodiments, the single string may include one string select transistor and one ground select transistor.

Referring to FIGS. 3D, 3E and 3F, the vertical flash memory device may include a ground select line 256, a wordline 252 and a string select line 254 that are spaced apart from each other along a first direction substantially perpendicular to a top surface of a substrate 101, and a channel 142 extending from the substrate 101 in the first direction on sidewalls of the ground select line 256, the wordline 252 and the string select line 254. The vertical flash memory device may further include a bitline 290 electrically connected to the channel 142, and a common source line 105. The bitline 290 may be electrically connected to the channel 142 via a pad 162 and a bitline contact 280.

The channel 142 may include polysilicon or doped polysilicon. For example, the channel 142 may include polysilicon doped with p-type impurities, e.g., polysilicon doped with indium or gallium. The channel 142 may further include carbon and/or germanium. A plurality of channels 142 may be formed in a second direction substantially parallel to the top surface of the substrate 101 to define a channel column, and a plurality of channel columns may be formed in a third direction substantially perpendicular to the second direction to define a channel array.

The channel 142 may be cup shaped and/or of a hollow cylindrical shape. A filling layer pattern 150 may be formed in a space defined by an inner sidewall of the, for example, cup shaped channel 142. The filling layer pattern 150 may include, for example, an insulating material (e.g., an oxide).

The pad 162 may be on the filling layer pattern 150 and the channel 142, and may electrically connect the channel 142 to the bitline contact 280. The pad 162 may serve as a source/drain region by which charges may be moved through the channel 142. The pad 162 may include doped polysilicon. For example, the pad 162 may include polysilicon doped with impurities, e.g., phosphorous, arsenic, and so on. When the pad 162 includes polysilicon doped with phosphorous, the pad 162 may further include carbon.

Each of the ground select line 256, the wordline 252 and the string select line 254 may be at a single level (e.g., one of each, each at a different height) or more than one level, and a first insulation layer pattern 115 may be interposed therebetween. In FIG. 3D, the ground select line 256 and the string select line 254 may be at 2 levels (e.g., two of each at different heights), respectively, and the wordline 252 may be at 4 levels between the ground select line 256 and the string select line 254. However, the ground select line 256 and the string select line 254 may be at one level, and the wordline 252 may be formed at 2, 8 or 16 levels. According to example embodiments, each of the ground select line 256, the wordline 252 and the string select line 254 may extend in the second direction, and a plurality of ground select lines 256, a plurality of wordlines 252, and a plurality of string select lines 254 may be in the third direction. The first insulation layer pattern 115 may include, for example, a silicon oxide (e.g., silicon dioxide ($SiO_2$), silicon oxycarbide (SiOC) and/or silicon oxyfluoride (SiOF)).

A tunnel insulation layer pattern 225, a charge trapping layer pattern 235 and a blocking layer pattern 245 may be between each of the ground select line 256, the wordline 252 and the string select line 254, and an outer sidewall of the channel 142 in a direction substantially perpendicular to the outer sidewall of the channel 142. The tunnel insulation layer pattern 225, the charge trapping layer pattern 235 and the blocking layer pattern 245 may be between each of the ground select line 256, the wordline 252 and the string select line 254, and the first insulation layer pattern 115 and/or on a sidewall of the first insulation layer pattern 115. According to at least one example embodiment, the tunnel insulation layer pattern 225 may be only on the outer sidewall of the channel 142.

According to example embodiments, the ground select line 256, the wordline 252 and the string select line 254 may include, for example, a metal and/or a metal nitride. For example, the ground select line 256, the wordline 252 and the string select line 254 may include a metal and/or a metal nitride with low electrical resistance (e.g., tungsten, tungsten nitride, titanium, titanium nitride, tantalum, tantalum nitride and/or platinum). According to at least one example embodiment, each of the ground select line 256, the wordline 252 and the string select line 254 may be a multi-layered structure including a barrier layer, for example, a metal nitride and/or a metal layer including a metal.

According to example embodiments, the tunnel insulation layer pattern 225 may include a silicon oxide, and the charge trapping layer pattern 235 may include a nitride (e.g., a silicon nitride and/or a metal oxide). According to example embodiments, the blocking layer pattern 245 may include a silicon oxide and/or a metal oxide (e.g., aluminum oxide, hafnium oxide, lanthanum oxide, lanthanum aluminum oxide, lanthanum hafnium oxide, hafnium aluminum oxide, titanium oxide, tantalum oxide and/or zirconium oxide). According to at least one example embodiment, the blocking layer pattern 245 may be a multi-layered structure of a silicon oxide layer and a metal oxide layer.

A second insulation layer pattern 260 may be between structures each of which may include the ground select line 256, the wordline 252 and the string select line 254 extending in the second direction and the first insulation layer pattern 115 therebetween. The second insulation layer pattern 260 may include an insulating material (e.g., an oxide). The impurity region 105 may be at an upper portion of the substrate 100 beneath the second insulation layer pattern 260, which may extend in the second direction and serve as a common source line. According to example embodiments, the impurity region 105 may include n-type impurities, for example, phosphorus and/or arsenic.

The bitline 290 may be electrically connected to the pad 162 via the bitline contact 280, and may be electrically connected to the channel 142. The bitline 290 may include, for example, a metal, a metal nitride and/or doped polysilicon. According to example embodiments, the bitline 290 may extend in the third direction. The bitline contact 280 may be contained in a third insulation layer 270, and contact the pad 162. The bitline contact 280 may include, for example, a metal, a metal nitride and/or doped polysilicon. Metal lines 291 may be electrically connected to the ground select line 256, the wordline 252 and the string select line 254 through contact plugs 281, and thus electrical signals applied to the metal lines 291 may be provided to the ground select line 256, the wordline 252 and the string select line 254.

The third insulation layer 270 may be on the first and second insulation layer patterns 115 and 260, the channel 142, the pad 162, the blocking layer pattern 245, the charge trapping layer pattern 235 and the tunnel insulation layer pattern 225. According to example embodiments, the third insulation layer 270 may include an insulating material, for example, an oxide.

Figure 4:
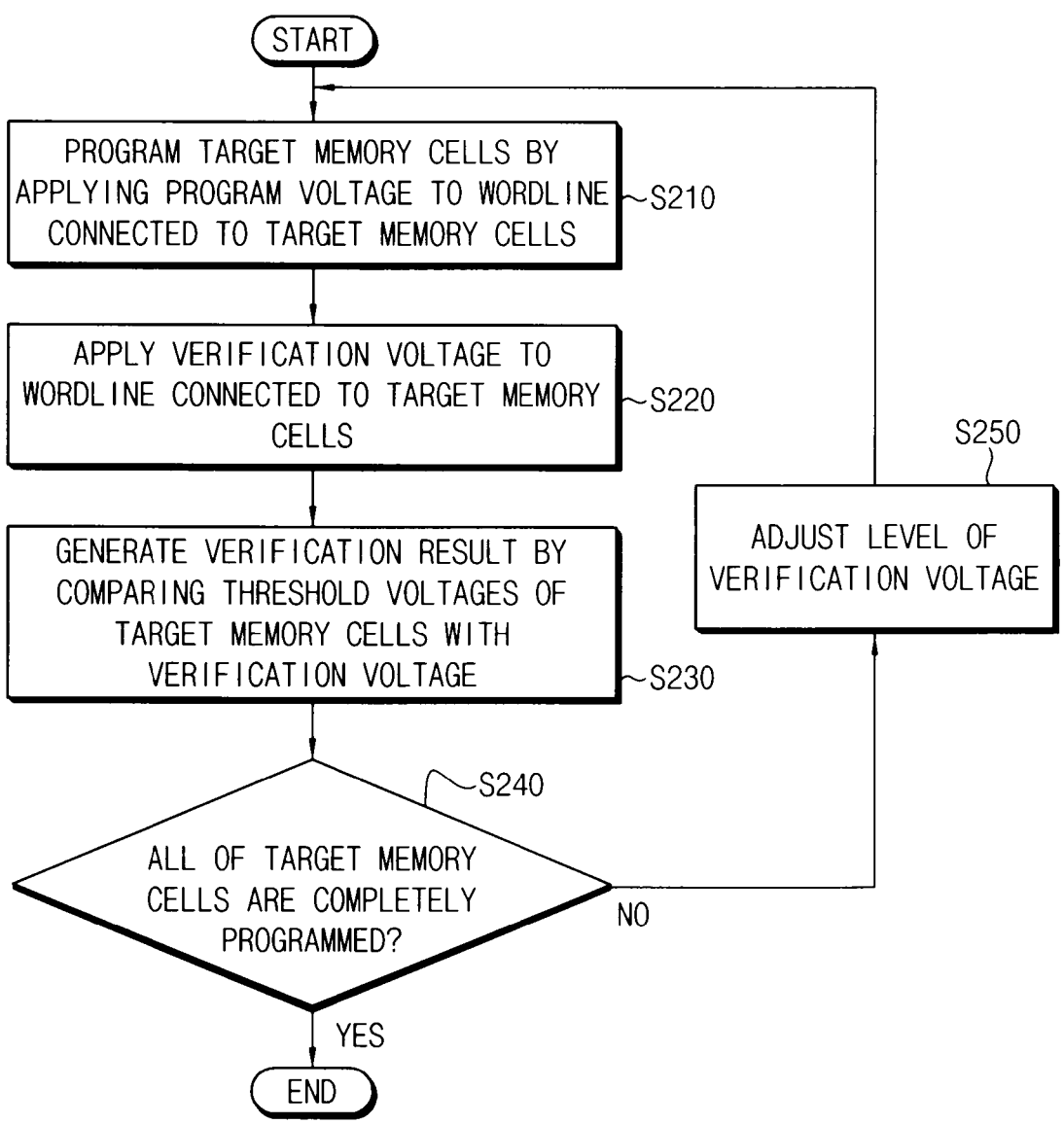
FIG. 4 is a flowchart illustrating an example of the method of FIG. 1 for storing data in the nonvolatile memory device.

FIG. 4 is a flowchart illustrating an example of the method of storing data in the nonvolatile memory device of FIG. 1.

Referring to FIGS. 2 and 4, in the method of storing data in the nonvolatile memory device, the target memory cells may be programmed by applying the program voltage to a wordline connected to the target memory cells (step S210). The program permission voltage may be applied to bitlines connected to the target memory cells, and a pass voltage may be applied to wordlines connected to the other memory cells.

The verification voltage may be applied to the wordline connected to the target memory cells (step S220), and a verification result may be generated by comparing threshold voltages of the target memory cells with the verification voltage (step S230). For example, the pass-fail detector 400 may generate the detection signal VRS corresponding to the verification result, and may provide the detection signal VRS to the control circuit 500. The detection signal VRS may have a first logic level when all of the target memory cells correspond to the normal program states, and may have a second logic level when at least one of the target memory cells corresponds to the failed program state.

It is determined whether target memory cells correspond to the failed program state or the normal program state based on the verification result (step S240). For example, the control circuit 500 may determine whether all of target memory cells are completely programmed based on the detection signal VRS.

If it is determined that at least one of the target memory cells corresponds to the failed program state, a level of the verification voltage may be adjusted (step S250). For example, the control circuit 500 may generate the voltage control signal VCTRL for adjusting the level of the verification voltage, and the voltage generator 600 may adjust the level of the verification voltage based on the voltage control signal VCTRL. The level of the verification voltage may be decreased by a step down level. In other words, a next level of the verification voltage in a next program loop is lower than a current level of the verification voltage in a current program loop by an amount of the step down level when the program loop is repeatedly performed. The step down level may be determined based on the voltage control signal VCTRL, and may be a fixed value or a variable value.

After the level of the verification voltage is adjusted, the program loop including steps S210, S220, S230 and S240 may be repeatedly performed. If it is determined that all of the target memory cells correspond to the normal program states, the program loop may not be repeated, and the method of storing data may be terminated.

Figure 5:
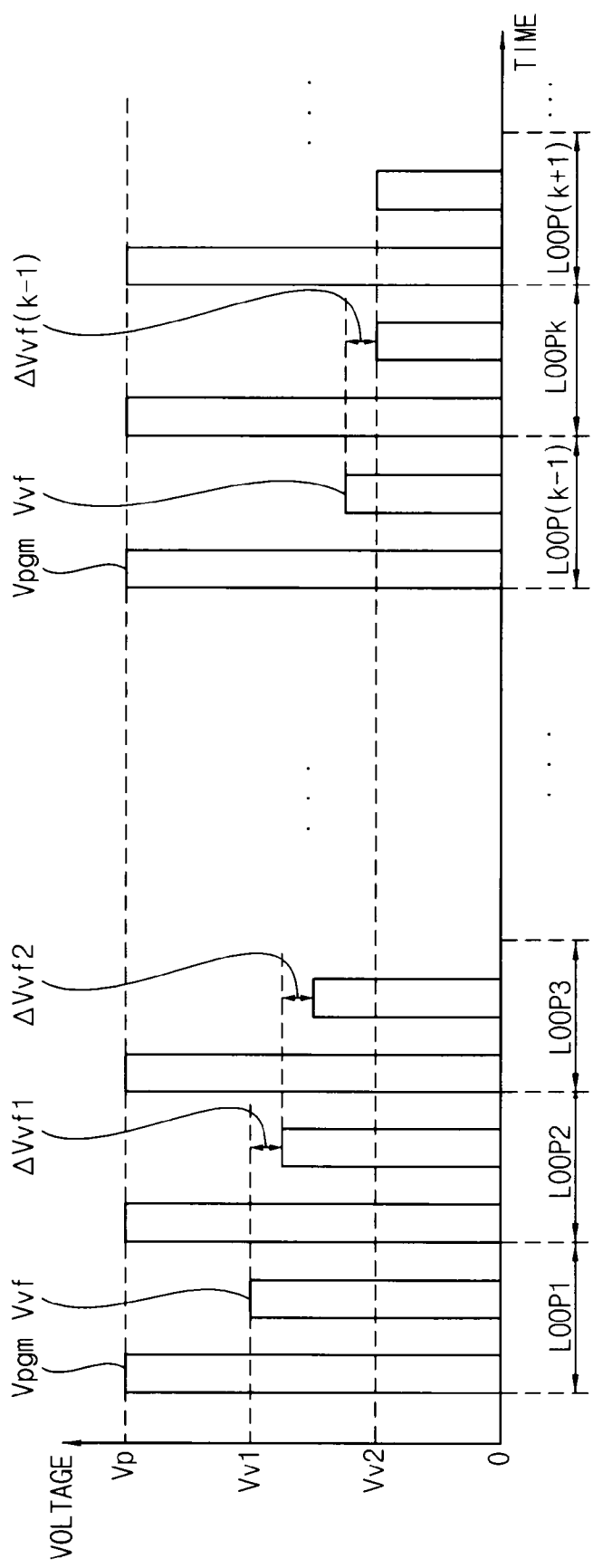
FIG. 5 is a timing diagram for use in describing the method of FIG. 4.

FIG. 5 is a diagram for describing an example of the method of FIG. 4.

Referring to FIG. 5, the program operation and the verification operation may be sequentially performed in each of program loops LOOP1, LOOP2, LOOP3, . . . , LOOP(k−1), LOOPk, LOOP(k+1). The program voltage Vpgm is applied to the wordline of the target memory cells in the program operation of each program loop, and the verification voltage Vvf is applied to the wordline of the target memory cells in the verification operation of each program loop.

The program voltage Vpgm has a fixed program level Vp even though the program loops LOOP1, . . . , LOOP(k+1) are repeatedly performed. A level of the verification voltage Vvf is decreased by one of step down levels ΔVvf1, ΔVvf2, . . . , ΔVvf(k−1) as the program loops LOOP1, . . . , LOOP(k+1) are repeatedly performed. For example, the verification voltage Vvf has an initial verification level Vv1 in a first program loop LOOP1, has a level that is lower than the initial verification level Vv1 by a first step down level ΔVvf1 in a second program loop LOOP2, and has a level that is lower than the level of the verification voltage Vvf in the second program loop LOOP2 by a second step down level ΔVvf2 in a third program loop LOOP3. In other words, the level of the verification voltage Vvf may be sequentially decreased as the program loops LOOP1, . . . , LOOP(k+1) are repeatedly performed. The magnitudes of the respective step down levels ΔVvf1, . . . , ΔVvf(k−1) may be the same as each other. Alternatively, the magnitudes of one or more of the step down levels ΔVvf1, . . . , ΔVvf(k−1) may be different that the magnitudes of one or more others of the step down levels ΔVvf1, . . . , ΔVvf(k−1).

If the level of the verification voltage Vvf is lower than a final verification level Vv2, reliability of the verification operation may not be guaranteed. Thus, when the level of the verification voltage Vvf is decreased to the final verification level Vv2, e.g., after a k-th program loop LOOPk, the level of the verification voltage Vvf is not decreased and is maintained at the final verification level Vv2 even though the program loops LOOP1, . . . , LOOP(k+1) are repeatedly performed. In other words, the next level of the verification voltage Vvf may be substantially the same as the current level of the verification voltage Vvf when the current level of the verification voltage Vvf corresponds to a predetermined reference level (e.g., the final verification level Vv2).

Figure 6:
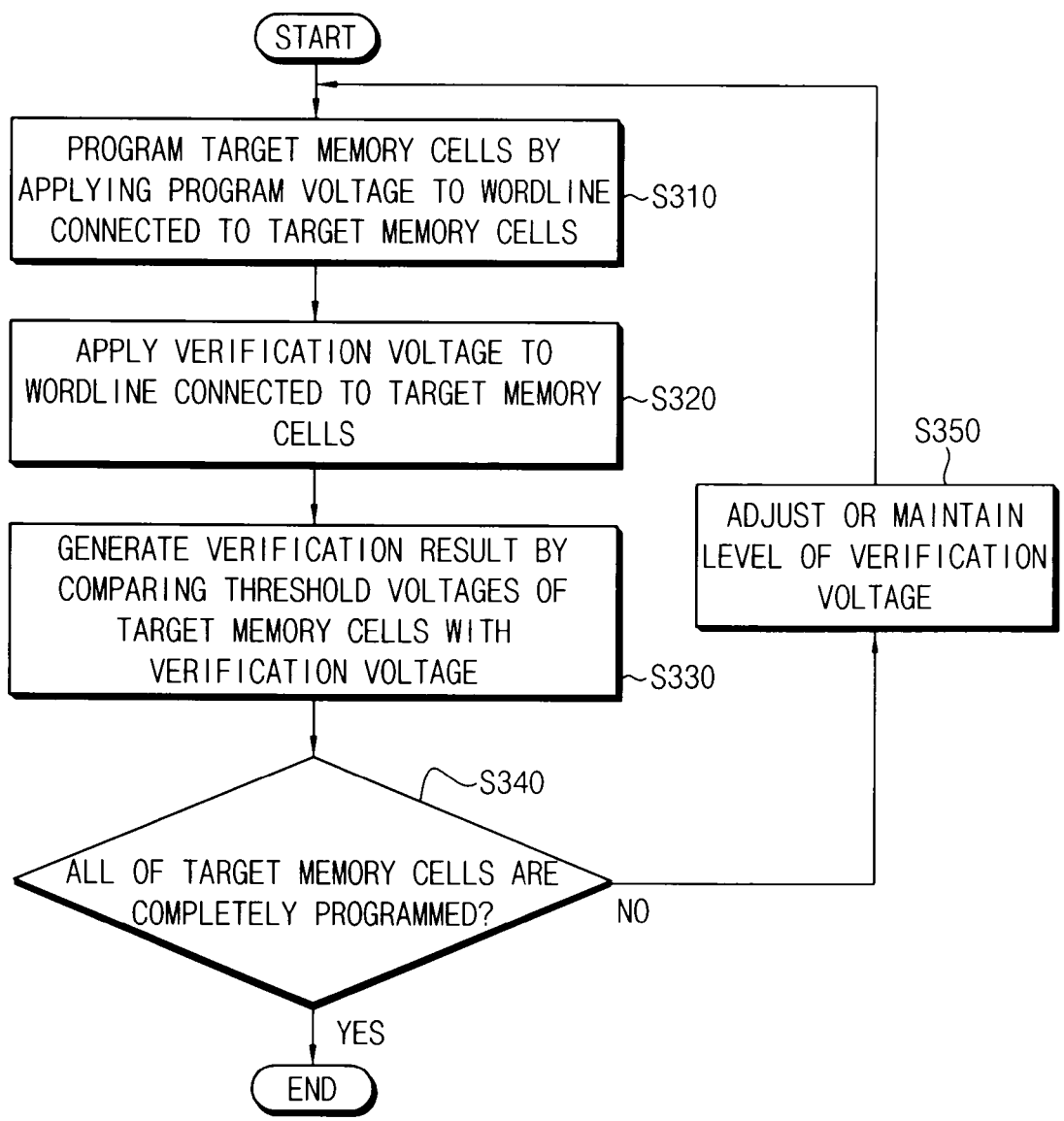
FIG. 6 is a flowchart illustrating another example of the method of FIG. 1 for storing data in the nonvolatile memory device.

FIG. 6 is a flowchart illustrating another example of the method of storing data in the nonvolatile memory device of FIG. 1.

Referring to FIGS. 2 and 6, in the method of storing data in the nonvolatile memory device, the target memory cells may be programmed by applying the program voltage to a wordline connected to the target memory cells (step S310), the verification voltage may be applied to the wordline connected to the target memory cells (step S320), verification result may be generated by comparing threshold voltages of the target memory cells with the verification voltage (step S330), and it is determined whether target memory cells correspond to the failed program state or the normal program state based on the verification result (step S340). The steps S310, S320, S330 and S340 may be substantially the same as the steps S210, S220, S230 and S240 of FIG. 4, respectively.

If it is determined that at least one of the target memory cells corresponds to the failed program state, a level of the verification voltage may be adjusted or may be maintained (step S350). For example, the control circuit 500 may generate the voltage control signal VCTRL for adjusting or maintaining the level of the verification voltage, and the voltage generator 600 may adjust or maintain the level of the verification voltage based on the voltage control signal VCTRL. In other words, a next level of the verification voltage in a next program loop is lower than or substantially the same as a current level of the verification voltage in a current program loop when the program loop is repeatedly performed.

After the level of the verification voltage is adjusted or maintained, the program loop including steps S310, S320, S330 and S340 may be repeatedly performed. In this embodiment, the next program loop may be one of a stationary program loop using the maintained verification voltage and a non-stationary program loop using the decreased verification voltage. If it is determined that all of the target memory cells correspond to the normal program states, the program loop may not be repeated, and the method of storing data may be terminated.

Figure 7:
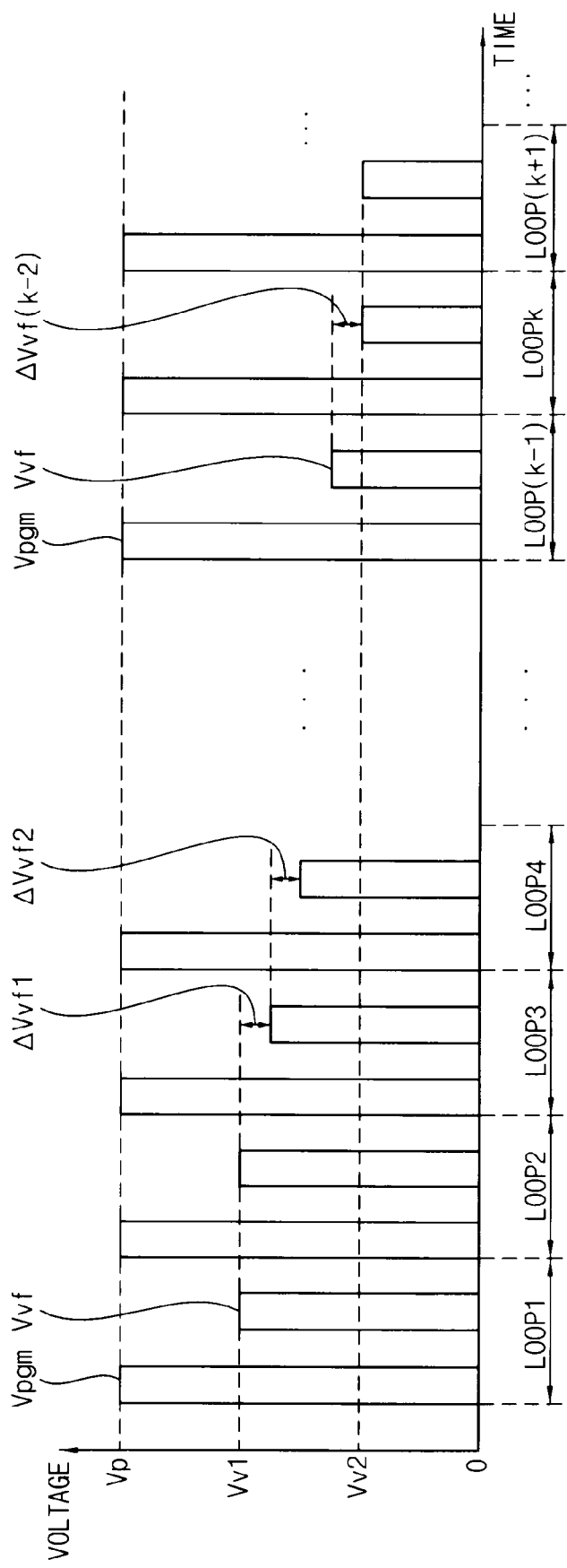
FIGS. 7 and 8 are timing diagrams for use in describing the method of FIG. 6.
Figure 8:
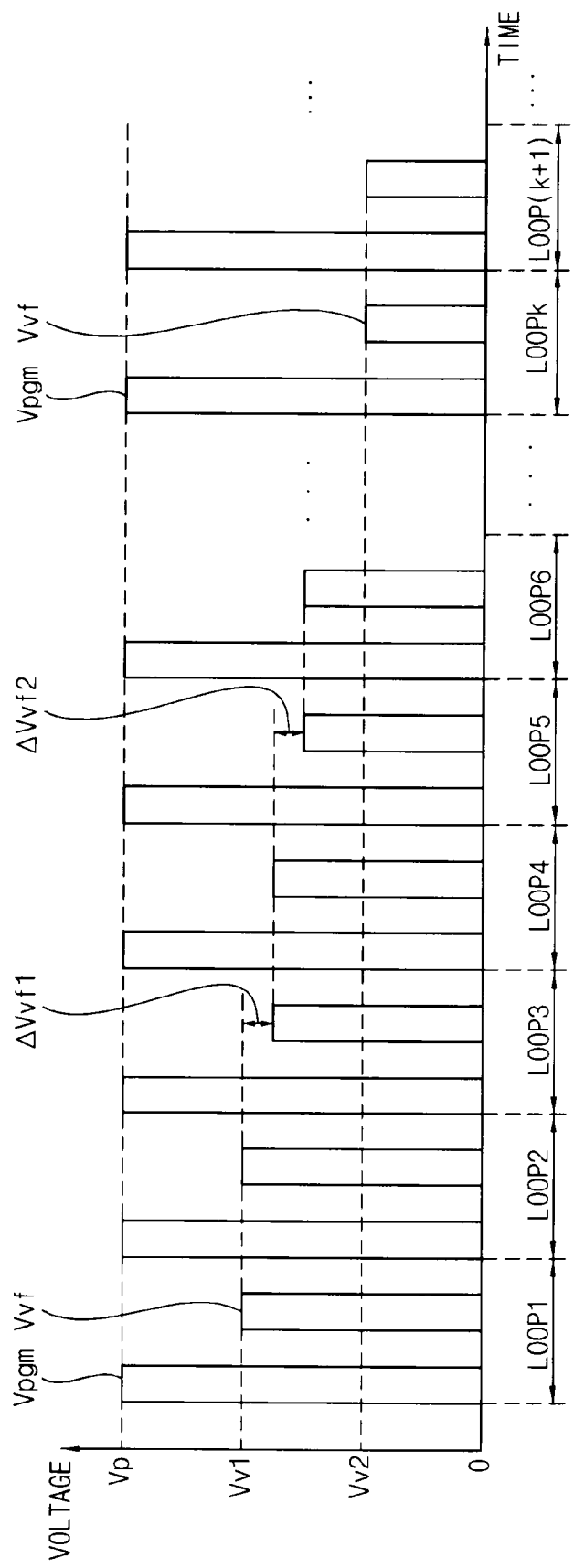

FIGS. 7 and 8 are diagrams for describing an example of the method of FIG. 6.

Referring to FIG. 7, the program operation and the verification operation may be sequentially performed in each of program loops LOOP1, LOOP2, LOOP3, LOOP4, . . . , LOOP(k−1), LOOPk, LOOP(k+1). The program voltage Vpgm has a fixed program level Vp. The verification voltage Vvf is maintained or decreased by one of step down levels ΔVvf1, ΔVvf2, . . . , ΔVvf(k−2).

For example, the verification voltage Vvf has an initial verification level Vv1 in a first program loop LOOP1 and a second program loop LOOP2, has a level that is lower than the initial verification level Vv1 by a first step down level ΔVvf1 in a third program loop LOOP3, and has a level that is lower than the level of the verification voltage Vvf in the third program loop LOOP3 by a second step down level ΔVvf2 in a fourth program loop LOOP4. In other words, the second program loop LOOP2 may correspond to the stationary program loop, and the third and fourth program loops LOOP3 and LOOP4 may correspond to the non-stationary program loop. The respective magnitudes of the step down levels may be the same each other or different from each other, and the verification voltage Vvf may be decreased to a final verification level Vv2.

Referring to FIG. 8, the program operation and the verification operation may be sequentially performed in each of program loops LOOP1, LOOP2, LOOP3, LOOP4, LOOP5, LOOP6, . . . , LOOPk, LOOP(k+1). The program voltage Vpgm has a fixed program level Vp. The verification voltage Vvf is maintained or decreased by one of step down levels ΔVvf1, ΔVvf2.

For example, the verification voltage Vvf has an initial verification level Vv1 in a first program loop LOOP1 and a second program loop LOOP2, has a level that is lower than the initial verification level Vv1 by a first step down level ΔVvf1 in a third program loop LOOP3 and a fourth program loop LOOP4, and has a level that is lower than the level of the verification voltage Vvf in the third program loop LOOP3 by a second step down level ΔVvf2 in a fifth program loop LOOP5 and a sixth program loop LOOP6. In other words, the second, fourth and sixth program loops LOOP2, LOOP4 and LOOP6 may correspond to the stationary program loop, and the third and fifth program loops LOOP3 and LOOP5 may correspond to the non-stationary program loop. The respective magnitudes of the step down levels may be the same each other or different from each other, and the verification voltage Vvf may be decreased to a final verification level Vv2.

Although FIG. 7 illustrates that one stationary program loop is performed at an initial operation time and FIG. 8 illustrates that the stationary program loop and the nonstationary program loop are alternately performed, the number of the stationary and nonstationary program loops and the timing points to perform the stationary and nonstationary program loops are not limited thereto.

Figure 9:
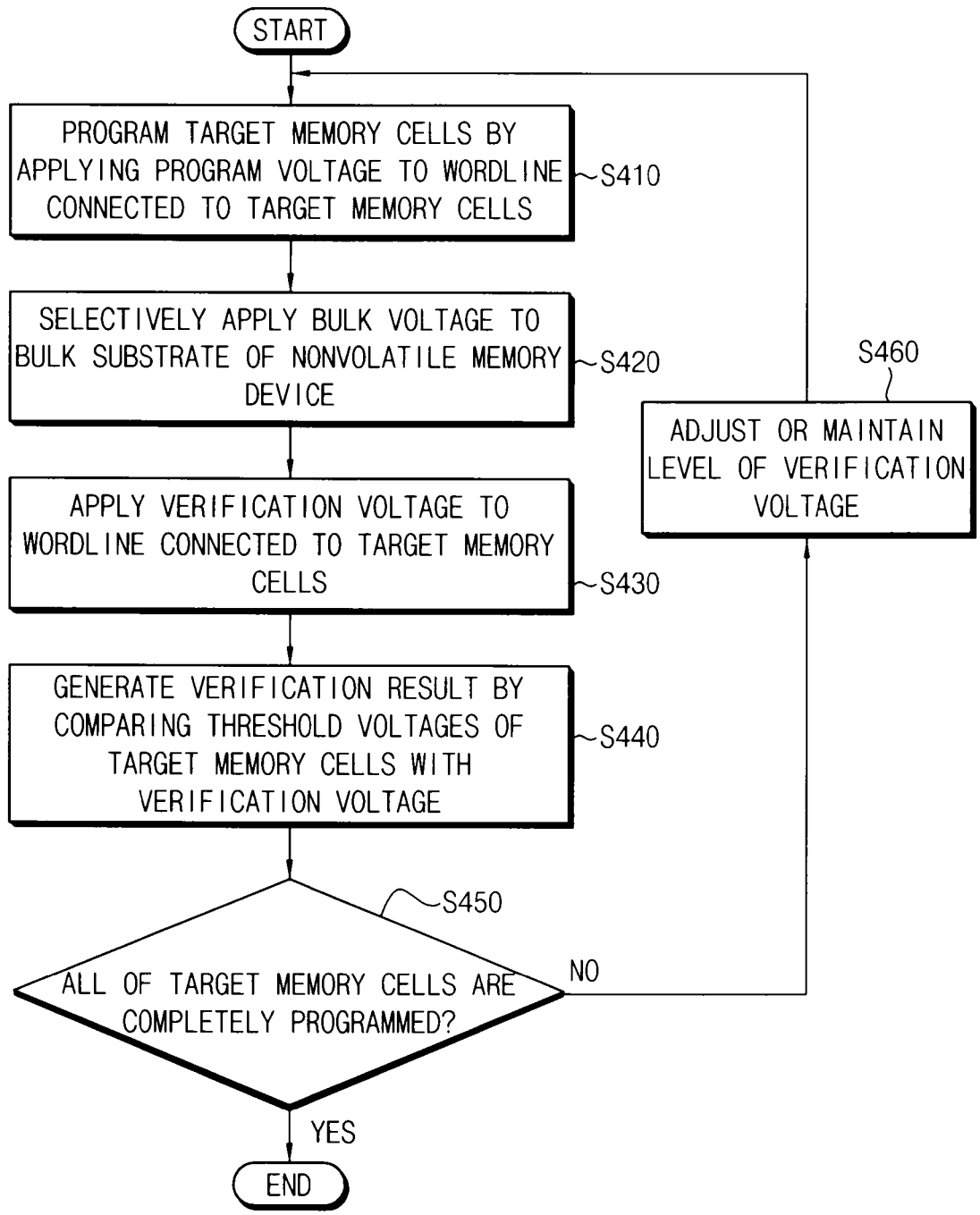
FIG. 9 is a flowchart illustrating still another example of the method of FIG. 1 for storing data in the nonvolatile memory device.

FIG. 9 is a flowchart illustrating still another example of the method of storing data in the nonvolatile memory device of FIG. 1.

Referring to FIGS. 2 and 9, in the method of storing data in the nonvolatile memory device, the target memory cells may be programmed by applying the program voltage to a wordline connected to the target memory cells (step S410). The step S410 may be substantially the same as the step S210 of FIG. 4.

A bulk voltage may be selectively applied to a bulk substrate of the nonvolatile memory device including the target memory cells (step S420). For example, the bulk voltage may be a negative voltage, and may have a fixed level. When the negative bulk voltage is applied to the bulk substrate, threshold voltages of the target memory cells may be changed. In this embodiment, current flowing through the target memory cells may be reduced based on the negative bulk voltage, and thus the nonvolatile memory device may achieve sufficient threshold voltage margin for the verification operation. The bulk voltage may have a range of about −0.1 to −0.7 volts in the NOR flash memory device.

The verification voltage may be applied to the wordline connected to the target memory cells (step S430). The level of the verification voltage may be changed as the program loops are repeatedly performed. The level of the verification voltage may also be changed depending on whether the bulk voltage is applied to the bulk substrate during the verification operation. For example, the verification voltage may have relatively high level when the bulk voltage is applied to the bulk substrate during the verification operation, and may have relatively low level when the bulk voltage is not applied to the bulk substrate during the verification operation.

Verification result may be generated by comparing threshold voltages of the target memory cells with the verification voltage (step S440), it is determined whether target memory cells correspond to the failed program state or the normal program state based on the verification result (step S450), and the level of the verification voltage may be adjusted or may be maintained if it is determined that at least one of the target memory cells corresponds to the failed program state (step S460). The steps S440 and S450 may be substantially the same as the steps S230 and S240 of FIG. 4, respectively. The step S460 may be substantially the same as the step S350 of FIG. 6.

After the level of the verification voltage is adjusted or maintained, the program loop including steps S410, S420, S430, S440 and S450 may be repeated. If it is determined that all of the target memory cells correspond to the normal program states, the program loop may not be repeated, and the method of storing data may be terminated.

Figure 10:
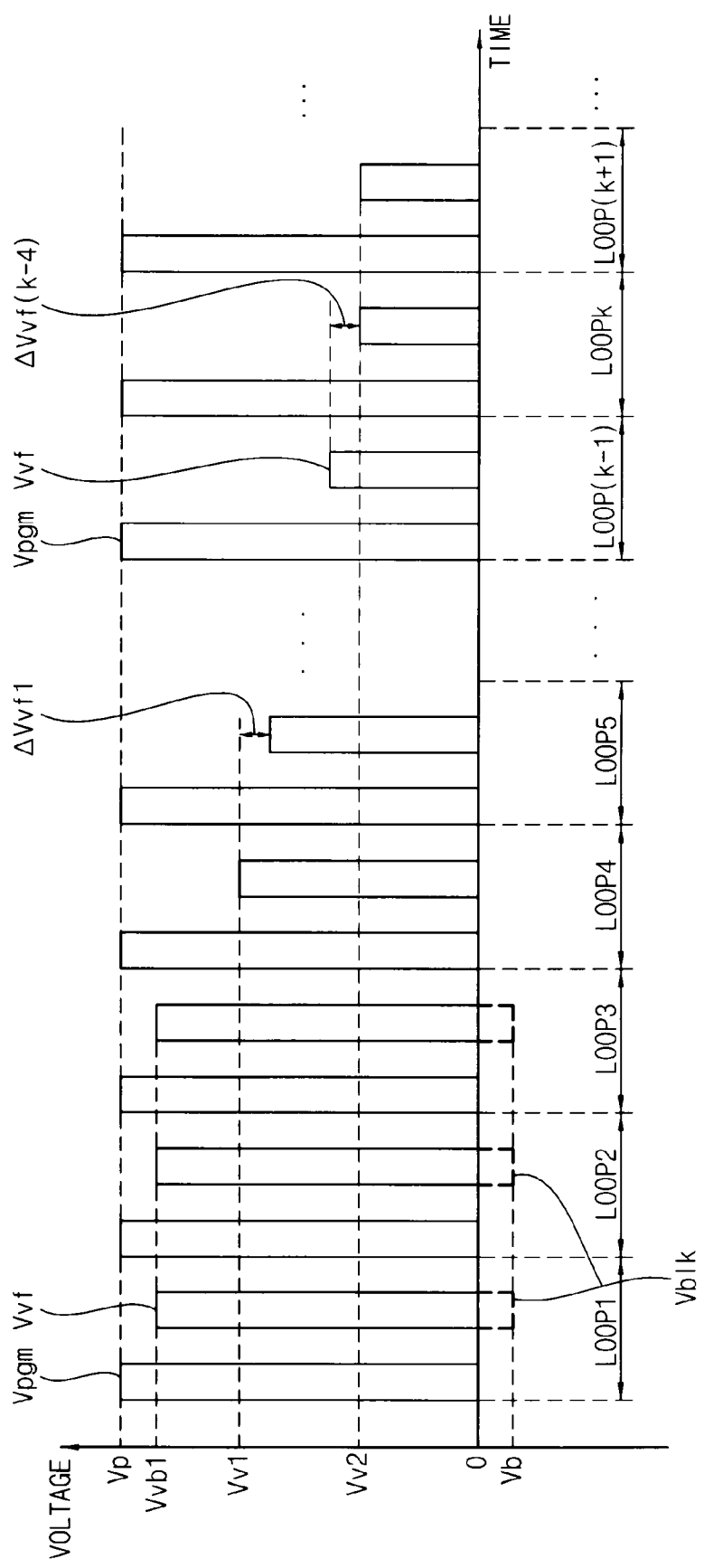
FIGS. 10 and 11 are timing diagrams for use in describing the method of FIG. 9.
Figure 11:
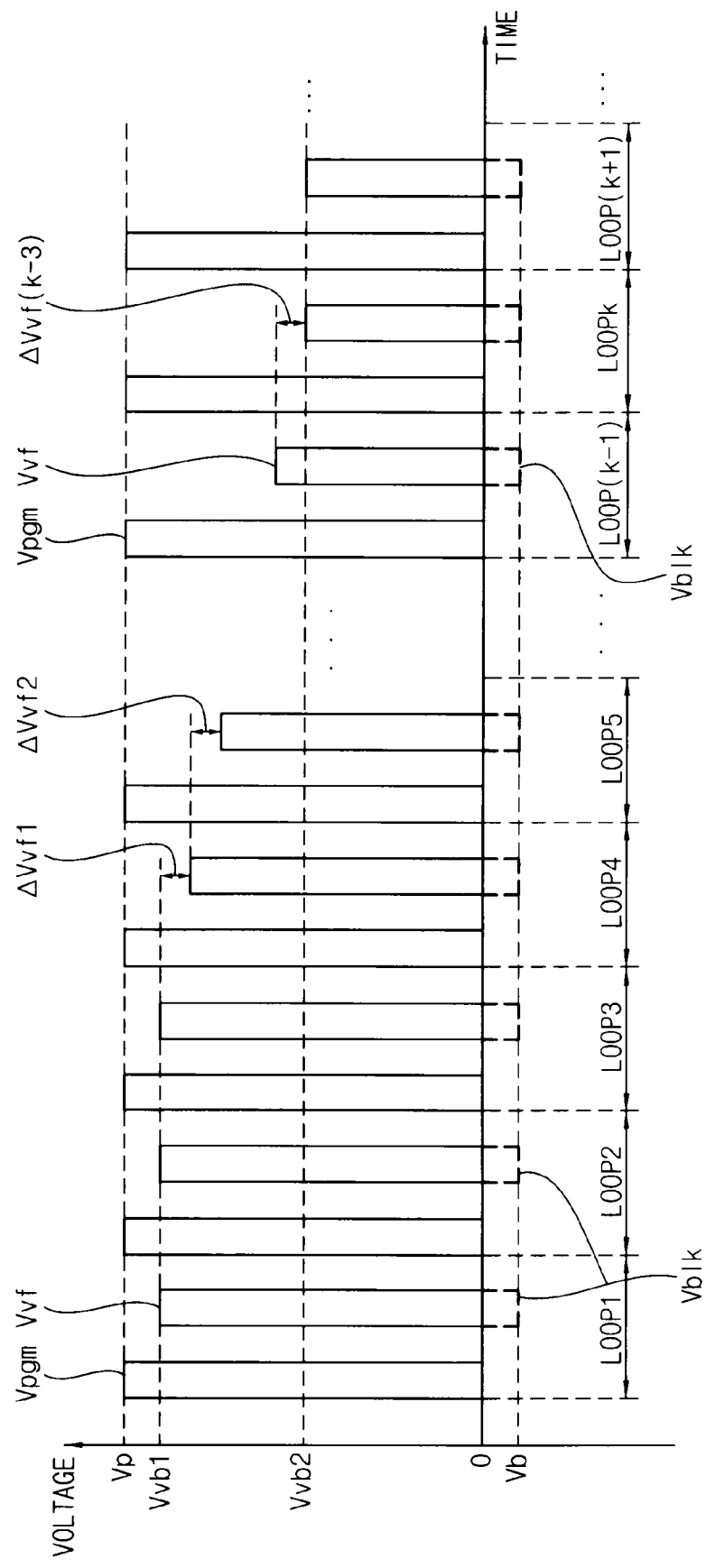

FIGS. 10 and 11 are diagrams for describing an example of the method of FIG. 9.

Referring to FIG. 10, the program operation and the verification operation may be sequentially performed in each of program loops LOOP1, LOOP2, LOOP3, LOOP4, LOOP5, . . . , LOOP(k−1), LOOPk, LOOP(k+1). The program voltage Vpgm has a fixed program level Vp. The verification voltage Vvf is maintained or decreased by one of step down levels ΔVvf1, . . . , ΔVvf(k−4).

In an example embodiment of FIG. 10, the bulk voltage Vblk is applied to the bulk substrate of the nonvolatile memory device during the verification operations of first through third program loops LOOP1, LOOP2, LOOP3 to prevent distortion of the threshold voltages in an initial operation time. In the first through third program loops LOOP1, LOOP2, LOOP3, the bulk voltage Vblk has a fixed bulk level Vb, and the verification voltage Vvf has an initial bulk verification level Vvb1 that is higher than an initial verification level Vv1.

The bulk voltage Vblk is not applied to the bulk substrate during the verification operations of the other program loops LOOP4, . . . , LOOP(k+1). The verification voltage Vvf is changed similarly to the example embodiment of FIG. 5. For example, the verification voltage Vvf has the initial verification level Vv1 in a fourth program loop LOOP4, and has a level that is lower than the initial verification level Vv1 by a first step down level ΔVvf1 in a fifth program loop LOOP5. The respective magnitudes of the step down levels may be the same each other or different from each other, and the verification voltage Vvf may be decreased to a final verification level Vv2.

Referring to FIG. 11, the program operation and the verification operation may be sequentially performed in each of program loops LOOP1, LOOP2, LOOP3, LOOP4, LOOP5, ..., LOOP(k−1), LOOPk, LOOP(k+1). The program voltage Vpgm has a fixed program level Vp. The verification voltage Vvf is maintained or decreased by one of step down levels ΔVvf1, ΔVvf2, ..., ΔVvf(k−3).

In an example embodiment of FIG. 11, the bulk voltage Vblk is applied to the bulk substrate of the nonvolatile memory device during the verification operations of all of the program loops LOOP1, ..., LOOP(k+1) to prevent distortion of the threshold voltages in a whole operation time. In comparison with the example embodiment of FIG. 5, the verification voltage Vvf may have relatively high level. The bulk voltage Vblk has a fixed bulk level Vb.

For example, the verification voltage Vvf has an initial bulk verification level Vvb1 in first through third program loops LOOP1, LOOP2, LOOP3, has a level that is lower than the initial bulk verification level Vvb1 by a first step down level ΔVvf1 in a fourth program loop LOOP4, and has a level that is lower than the level of the verification voltage Vvf in the fourth program loop LOOP4 by a second step down level ΔVvf2 in a fifth program loop LOOP5. The respective magnitudes of the step down levels may be the same each other or different from each other, and the verification voltage Vvf may be decreased to a final verification level Vv2.

Figure 12:
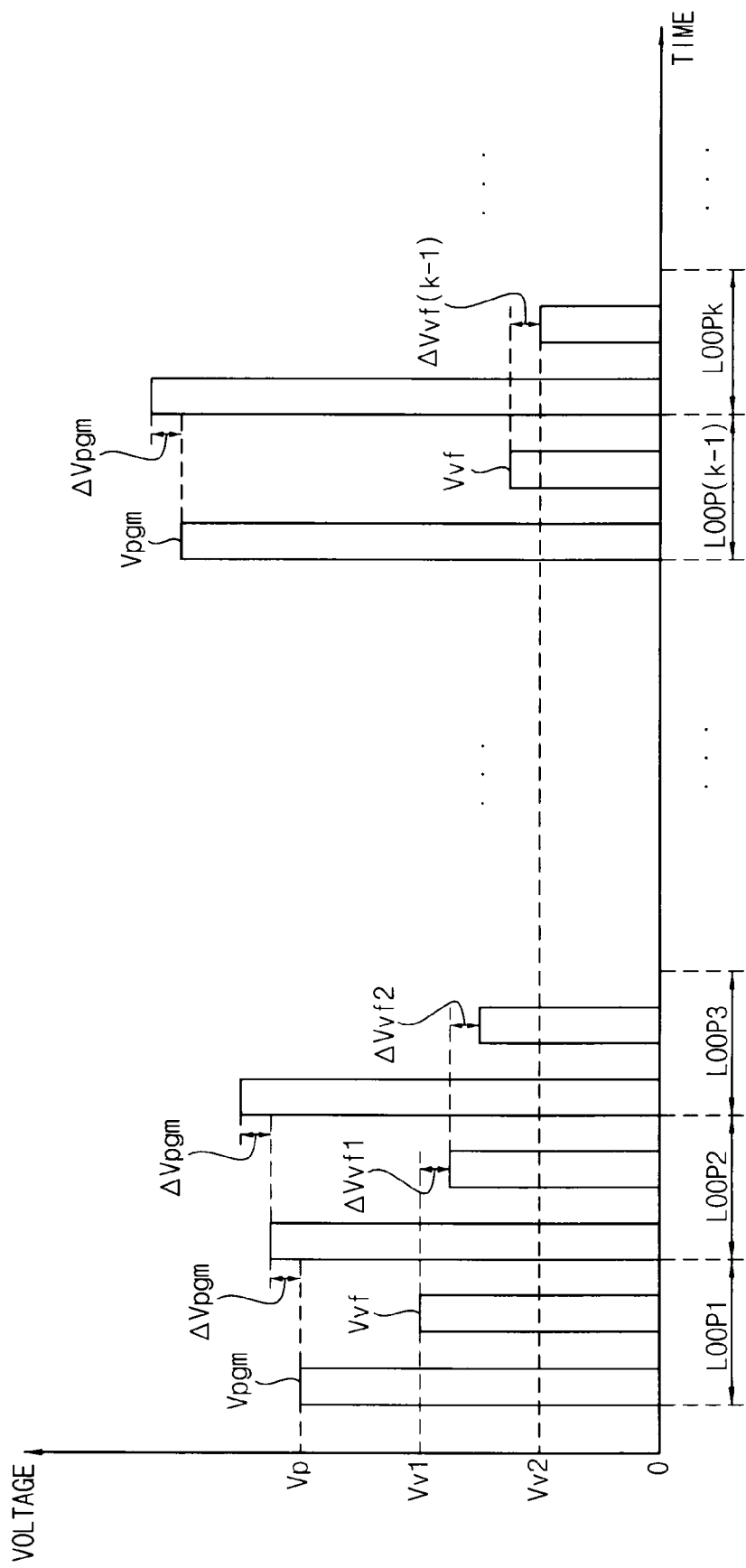
FIGS. 12 and 13 are timing diagrams for use in describing methods according to some example embodiments.
Figure 13:
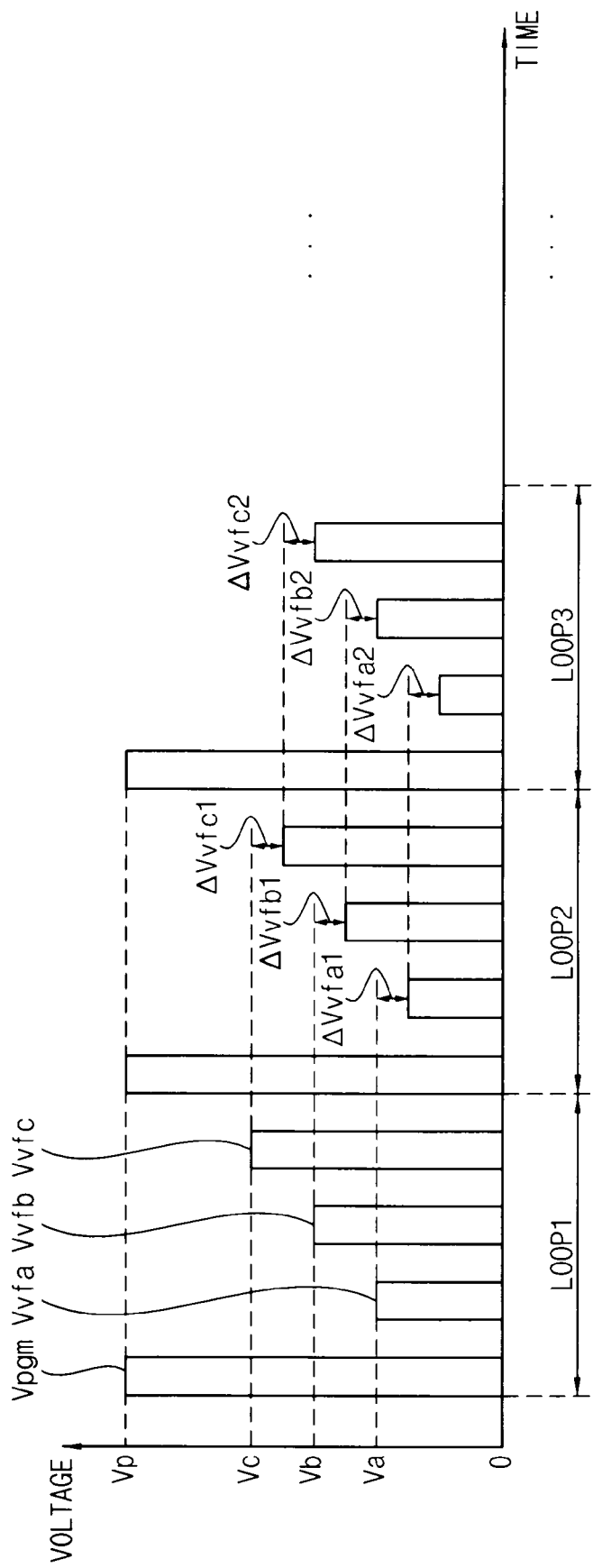

FIGS. 12 and 13 are diagrams for describing the method according to some example embodiments.

Referring to FIG. 12, the program operation and the verification operation may be sequentially performed in each of program loops LOOP1, LOOP2, LOOP3, ..., LOOP(k−1), LOOPk.

In an example embodiment of FIG. 12, incremental step pulses may be used in the program operations. For example, the program voltage Vpgm is increased from an initial program level Vp by step up level ΔVpgm. The program loops LOOP1, ..., LOOPk are repeatedly performed while increasing the program voltage Vpgm step-by-step. As described above with reference to FIG. 2, the number of pulses, a generation timing of pulses, and a level of a start pulse (e.g., the initial program level Vp) may be determined based on the voltage control signal VCTRL.

The verification voltage Vvf is changed similarly to the example embodiment of FIG. 5. For example, the verification voltage Vvf is decreased by one of step down levels ΔVvf1, ΔVvf2, ..., ΔVvf(k−1) as the program loops are repeatedly performed. The respective magnitudes of the step down levels may be the same each other or different from each other, and the verification voltage Vvf may be decreased to a final verification level Vv2.

Although not illustrated in FIG. 12, ISPP may be used in various example embodiments. For example, incremental step pulses may be used in the program operations in example embodiments of FIGS. 7, 8, 10 and 11.

Referring to FIG. 13, the program operation and the verification operation may be sequentially performed in each of program loops LOOP1, LOOP2, LOOP3. The program voltage Vpgm is applied to the wordline of the target memory cells in the program operation, and the verification voltages Vvfa, Vvfb, Vvfc are sequentially applied to the wordline of the target memory cells in the verification operation. The program voltage Vpgm has a fixed program level Vp.

In an example embodiment of FIG. 13, the target memory cells may be multi-level memory cells in which more than two bits are stored in each of memory cells. For example, two bits may be stored in each of the target memory cells. If two bits are stored in each of the target memory cells, a threshold voltage may have four distinctive distributions, and three verification voltages Vvfa, Vvfb, Vvfc may be used to verify such four distinctive distributions of the threshold voltage.

Levels of the verification voltages Vvfa, Vvfb, Vvfc are decreased by one of step down levels ΔVvfa1, ΔVvfb1, ΔVvfc1, ΔVvfa2, ΔVvfb2, ΔVvfc2 as the program loops LOOP1, LOOP2, LOOP3 are repeatedly performed. For example, a first verification voltage Vvfa has a first initial verification level Va in a first program loop LOOP1, has a level that is lower than the first initial verification level Va by a first step down level ΔVvfa1 in a second program loop LOOP2, and has a level that is lower than the level of the first verification voltage Vvfa in the second program loop LOOP2 by a second step down level ΔVvfa2 in a third program loop LOOP3. The respective magnitudes of the step down levels may be the same each other or different from each other, and the verification voltages Vvfa, Vvfb, Vvfc may be decreased to final verification levels.

According to example embodiments, X bits may be stored in each of the target memory cells, where X is a natural number equal to or greater than two. In this embodiment, $(2^X-1)$ verification voltages may be used to verify $2^X$ distinctive distributions of the threshold voltage.

According to example embodiments, the multi-level memory cells may have a structure having a charge storage layer such as a charge trap flash structure, a stack flash structure, a non-source/drain flash structure, a pin-type flash structure, and so on.

Although not illustrated in FIG. 13, a plurality of verification voltages may be used in various example embodiments if the target memory cells are multi-level memory cells. For example, a plurality of verification voltages may be used in the verification operations in example embodiments of FIGS. 5, 7, 8, 10, 11 and 12.

Although FIGS. 5, 7, 8, 10, 11, 12 and 13 illustrates that the program level Vp is higher than both the initial verification level Vv1 and the final verification level Vv2, the program level may be lower than the initial verification level Vv1 and/or the final verification level Vv2, according to example embodiments.

In the method of storing data in the nonvolatile memory device according to some example embodiments, when the program loop is repeatedly performed, the level of the verification voltage may be changed with various manners as described above with reference to FIGS. 4 through 13. Thus, in the nonvolatile memory device using the method of storing data in the nonvolatile memory device according to some example embodiments, the number of repeated program loop may be reduced, program time and verification time may be reduced without degrading characteristic of threshold voltage distributions for target memory cells, and data may be effectively stored in the target memory cells.

Figure 14:
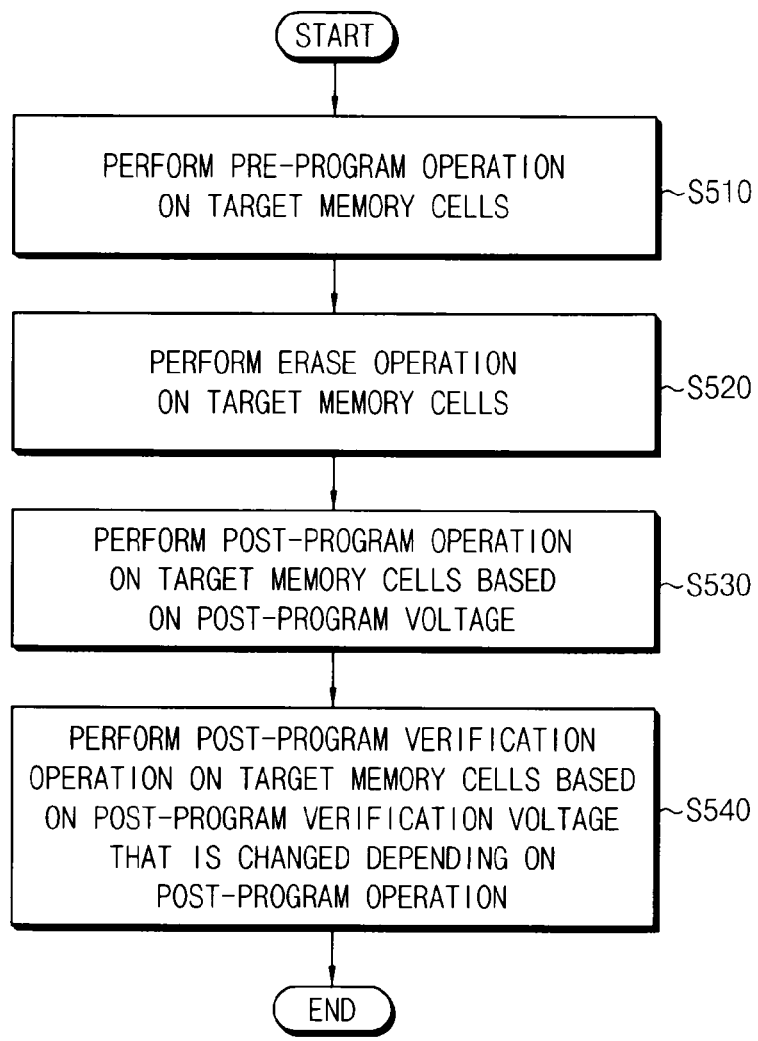
FIG. 14 is a flowchart illustrating a method of storing data in a nonvolatile memory device according to other example embodiments.
Figure 15A:
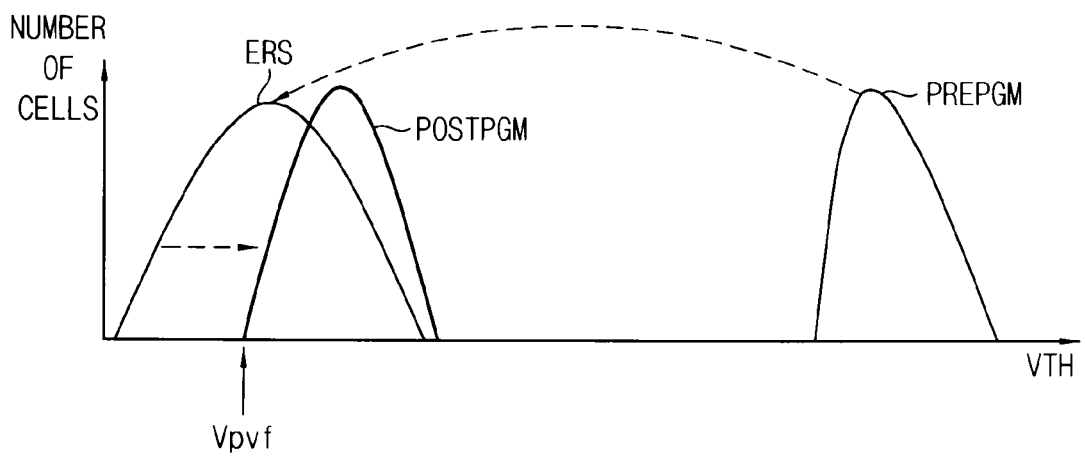
FIG. 15A is a threshold voltage distribution diagram and 15B is a timing diagram for use in describing the method of FIG. 14.
Figure 15B:
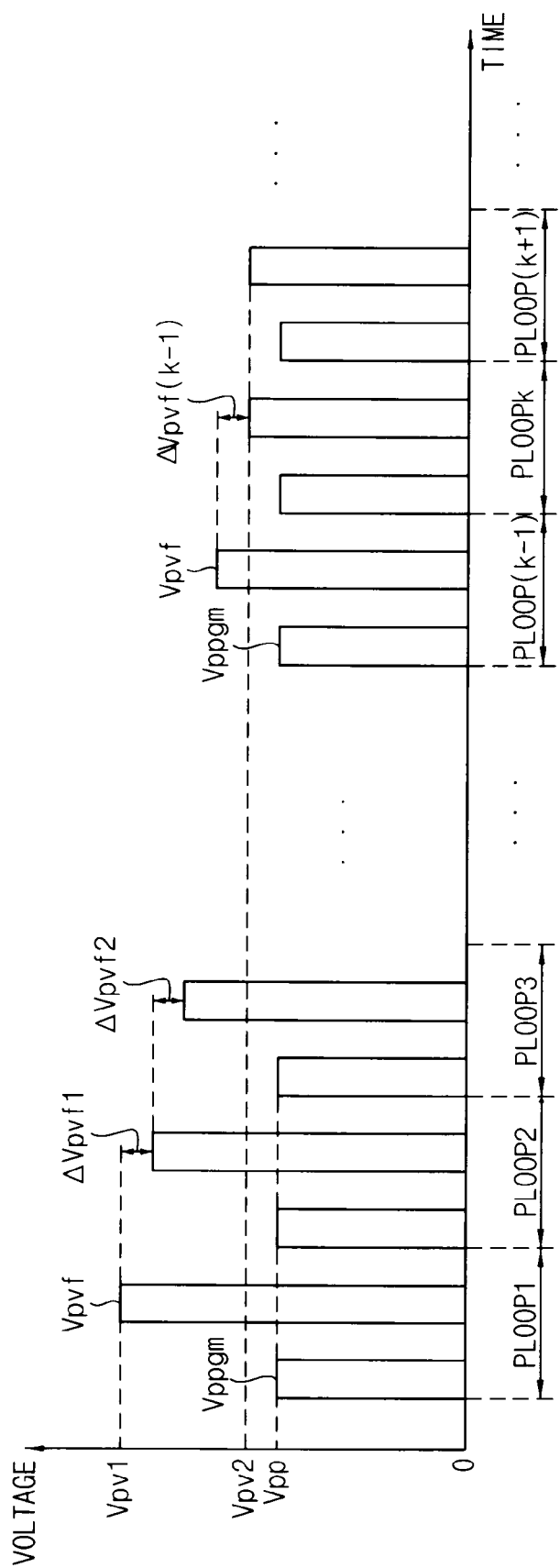

FIG. 14 is a flowchart illustrating a method of storing data in a nonvolatile memory device according to other example embodiments. FIGS. 15A and 15B are diagrams for describing the method of FIG. 14. FIG. 15A illustrates threshold voltage distributions for target memory cells after a pre-program operation, an erase operation and a post-program operation. FIG. 15B illustrates that the post-program operation and a post-program verification operation are repeatedly performed.

The method illustrated in FIG. 14 may be applied in a nonvolatile memory device performing a pre-program operation before an erase operation and a post-program operation after the erase operation in an erase mode. For example, in a NOR flash memory device, the erase operation may be performed per block. As illustrated in FIG. 15A, in the erase mode, the NOR flash memory device may perform the pre-program operation PREPGM such that all of target memory cells have the same state, may perform the erase operation ERS to discharge the target memory cells, and may perform the post-program operation POSTPGM to enhance characteristic of threshold voltage distributions for the target memory cells. Hereinafter, the method of FIG. 14 will be described based on the NOR flash memory device. However, the method of FIG. 14 may be applied in various nonvolatile memory devices.

Referring to FIG. 14, in the method of storing data in the nonvolatile memory device, a pre-program operation is performed on target memory cells among a plurality of memory cells (step S510). For example, in the NOR flash memory device, the target memory cells may be included in a block of which data are erased. A pre-program voltage may be applied to first wordlines connected to the target memory cells, a program permission voltage may be applied to first bitlines connected to the target memory cells, and a first bulk voltage may be applied to a bulk substrate of the NOR flash memory device including the target memory cells. A pass voltage may be applied to second wordlines that are not connected to the target memory cells, a program inhibition voltage may be applied to second bitlines that are not connected to the target memory cells.

An erase operation is performed on the target memory cells after the pre-program operation (step S520). For example, an erase voltage may be applied to the first wordlines, the first bitlines may be in a floating state, and a second bulk voltage may be applied to the bulk substrate.

A post-program operation is performed on the target memory cells based on a post-program voltage after the erase operation (step S530). For example, a post-program voltage that is lower than the pre-program voltage may be applied to the first wordlines, the program permission voltage may be applied to the first bitlines, and the first bulk voltage may be applied to the bulk substrate. After the post-program operation, a post-program verification operation is performed on the target memory cells based on a post-program verification voltage to determine whether all of the target memory cells are completely programmed (step S540).

The steps S530 and S540 may be substantially the same as the steps S110 and S120 of FIG. 1, respectively, and may be performed in a manner similar to the example embodiments of FIGS. 4, 6 and 9. For example, a post-program loop including the post-program operation and the post-program verification operation may be selectively repeated. As the post-program loop is repeatedly performed, a next level of the post-program verification voltage in a next post-program loop may be lower than or substantially the same as a current level of the post-program verification voltage in a current post-program loop. In an example embodiment, the first bulk voltage may be selectively applied to the bulk substrate during the post-program verification operation. A level of post-program verification voltage may be higher than a level of the post-program voltage.

Referring to FIG. 15B, the post-program operation and the post-program verification operation may be sequentially performed in each of post-program loops PLOOP1, PLOOP2, PLOOP3, . . . , PLOOP(k−1), PLOOPk, PLOOP(k+1). The post-program voltage Vppgm is applied to the first wordlines in the post-program operation, and the post-program verification voltage Vpvf is applied to the first wordlines in the post-program verification operation. The post-program voltage Vppgm has a fixed post-program level Vpp. A level of the post-program verification voltage Vpvf is decreased from an initial post-program verification level Vpv1 to a final post-program verification level Vpv2 by one of step down levels ΔVpvf1, ΔVpvf2, . . . , ΔVpvf(k−1) as the post-program loops PLOOP1, . . . , PLOOP(k+1) are repeatedly performed. For example, the post-program level Vpp may be about 2 volts, the initial post-program verification level Vpv1 may be about 2.5 volts, and the final post-program verification level Vpv2 may have a range of about 0.5 to 3 volts.

Although FIG. 15B illustrates that the final post-program verification level Vpv2 is higher than the post-program level Vpp, the final post-program verification level may be lower than the post-program level, according to example embodiments. Although not illustrated in FIG. 15B, the post-program verification voltage Vpvf may be changed similarly to the example embodiments of FIGS. 7, 8, 10, 11, 12 and 13, according to example embodiments. For example, as illustrated in FIG. 10, when the bulk voltage Vblk is applied to the bulk substrate during the post-program verification operations of first through third program loops LOOP1, LOOP2, LOOP3, the bulk voltage Vblk may have a range of about −0.1 to −0.7 volts, and the level of the post-program verification voltage in the first through third program loops LOOP1, LOOP2, LOOP3 may be about 3.70 volts.

Although not illustrated in FIGS. 14 and 15B, in the method of storing data in the nonvolatile memory device according to other example embodiments, a pre-program verification operation and/or an erase verification operation may be further performed. In this embodiment, the pre-program verification operation may be performed based on a pre-program verification voltage that is changed depending on the pre-program operation. The erase verification operation may be performed based on an erase verification voltage that is changed depending on the erase operation.

Figure 16A:
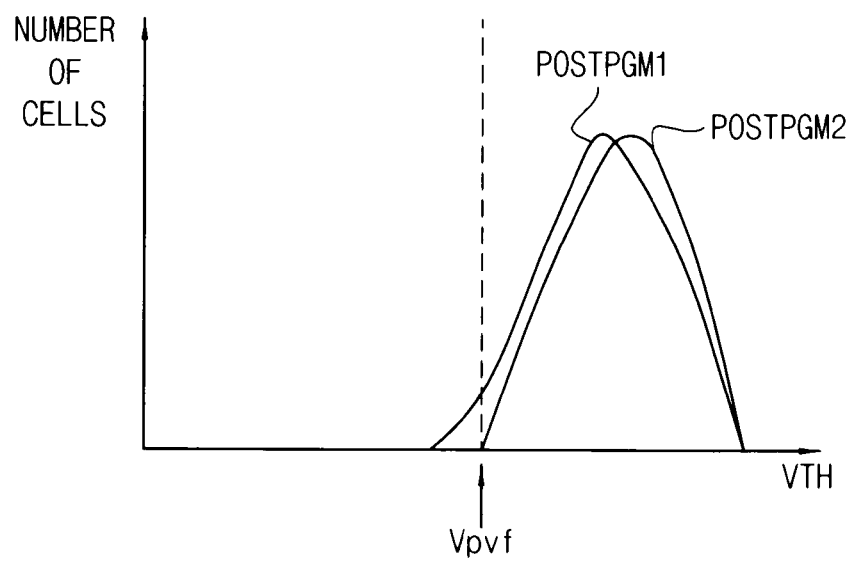
FIGS. 16A, 16B and 16C are a threshold voltage distribution diagram, a cycle number diagram, and a random telegraph noise diagram, respectively, for use in describing a performance of the method of FIG. 14.
Figure 16B:
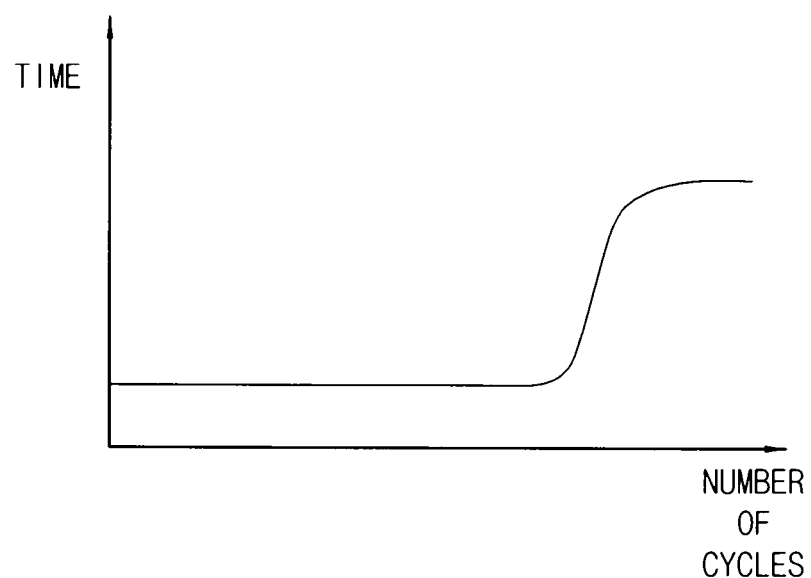
Figure 16C:
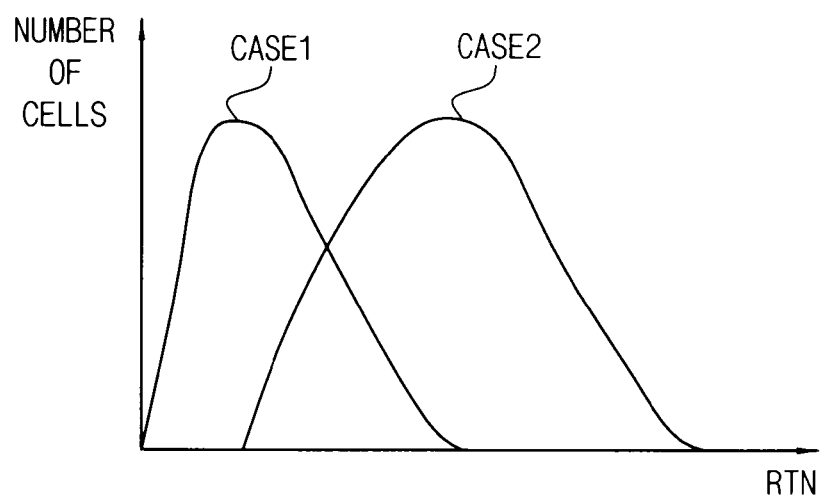

FIGS. 16A, 16B and 16C are diagrams for describing performance of the method of FIG. 14. FIG. 16A illustrates threshold voltage distributions for target memory cells after post-program operation according to gate critical dimension (CD) values of the target memory cells. FIG. 16B illustrates completion time of the post-program operation according to the number of endurance tests. FIG. 16C illustrates distributions of RTN included in the target memory cells according to the endurance test.

Referring to FIG. 16A, POSTPGM1 represents a threshold voltage distribution after the post-program operation when a gate CD value of the memory cell is smaller than a target value. POSTPGM2 represents a threshold voltage distribution after the post-program operation when the gate CD value of the memory cell is substantially the same as the target value. In comparison with POSTPGM2, a large number of memory cells may have threshold voltages that are lower than a post-program verification voltage Vpvf in POSTPGM 1. Thus, when the gate CD value of the memory cell is smaller than the target value, the post-program loop may be repeatedly performed a relatively large number of times, the time required to complete the post-program may be relatively long, and post-program characteristics for target memory cells may be degraded.

Referring to FIG. 16B, the time required to complete the post-program operation may increase as the number of endurance tests increases. Referring to FIG. 16C, CASE1 represents a distribution of RTN in the target memory cells before the endurance test. CASE2 represents a distribution of RTN in the target memory cells after the endurance test. After the endurance test is performed, the RTN in the target memory cells may increase. Thus, the post-program characteristics for target memory cells may be degraded as the erase and program operations are repeatedly performed.

As described above, the time required to complete the post-program operation may increase and the post-program characteristic may be degraded due to a reduction of the gate CD value of the memory cell, a variation of a wordline voltage, and a decrease of endurance. In the method of storing data in the nonvolatile memory device according to other example embodiments, the level of the post-program verification voltage may be changed as the post-program loop is repeatedly performed. Thus, in the nonvolatile memory device using the method of storing data in the nonvolatile memory device according to other example embodiments, the number of repeated post-program loops may be reduced, the time required to complete the post-program may be relatively short, and post-program characteristics for target memory cells may be enhanced.

Figure 17:
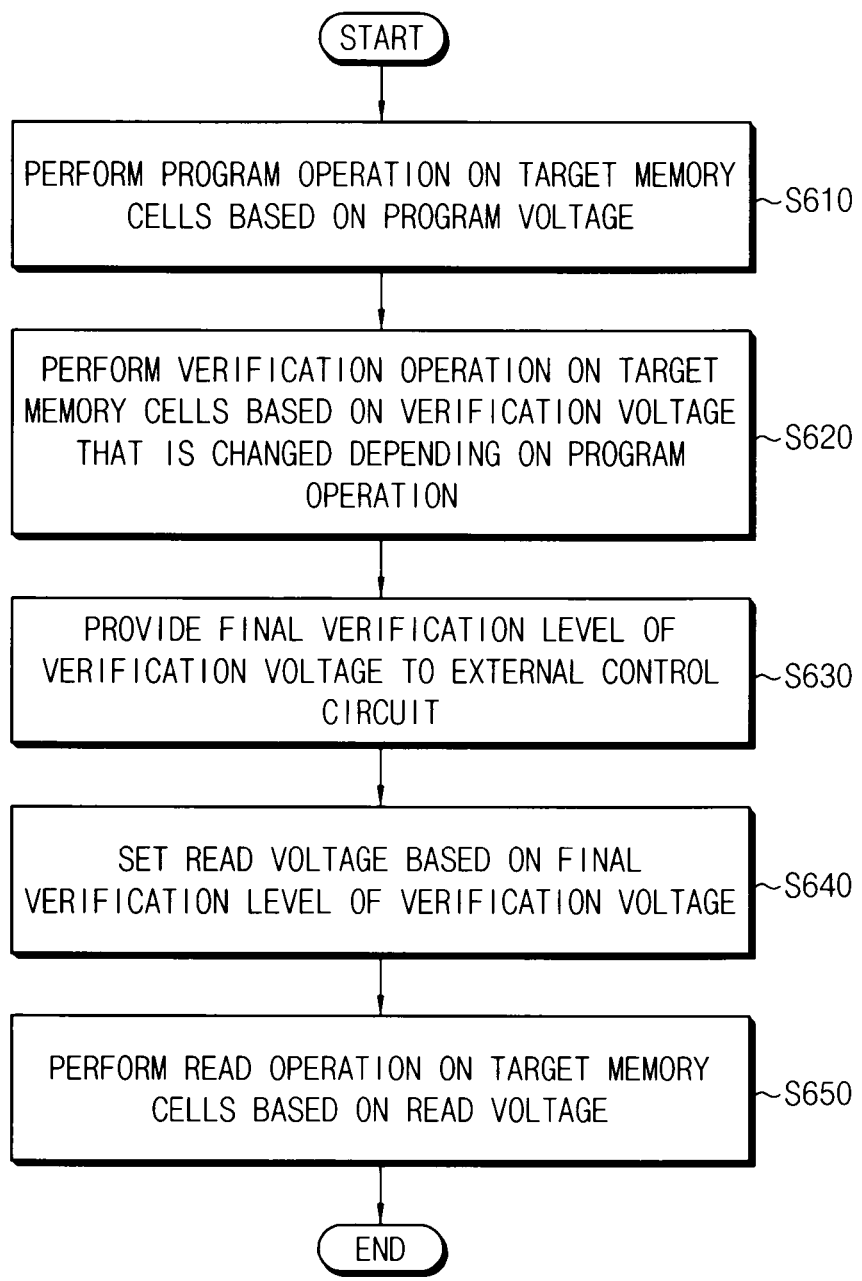
FIG. 17 is a flowchart illustrating a method of operating a nonvolatile memory device according to some example embodiments.

FIG. 17 is a flowchart illustrating a method of operating a nonvolatile memory device according to some example embodiments.

Referring to FIGS. 2 and 17, in the method of operating the nonvolatile memory device according to some example embodiments, a program operation is performed on target memory cells among a plurality of memory cells based on a program voltage (step S610), and a verification operation is performed on the target memory cells based on a verification voltage to determine whether all of the target memory cells are completely programmed (step S620). The verification voltage is changed depending on the program operation. The steps S610 and S620 may be substantially the same as the steps S110 and S120 of FIG. 1, respectively, and may be performed in a manner similar to the example embodiments of FIGS. 4, 6 and 9.

A final verification level of the verification voltage is provided to an external control circuit (step S630). The final verification level of the verification voltage is determined based on a result of the verification operation (e.g., the verification result). For example, the control circuit 500 may receive the detection signal VRS corresponding to the verification result and/or the final verification level. The final verification level may be used to set a read condition (e.g., a level of a read voltage) when it is determined that all of the target memory cells correspond to the normal program states. For another example, the external control circuit may be included in a memory controller (not illustrated) that is located outside the nonvolatile memory device 10. The external control circuit may receive the final verification level of the verification voltage.

A read voltage is set based on the final verification level of the verification voltage (step S640), and a read operation is performed on the target memory cells based on the read voltage (step S650). For example, the control circuit 500 may generate the voltage control signal VCTRL for setting a level of the read voltage, and the voltage generator 600 may set the level of the read voltage to be substantially the same as the final verification level based on the voltage control signal VCTRL. In the read mode, the read voltage may be applied to a wordline of the target memory cells, and the I/O circuit 300 may sense a voltage on bitlines of the target memory cells to output read data.

In the method of operating the nonvolatile memory device according to some example embodiments, the level of the verification voltage may be changed as the program loop is repeatedly performed. Thus, the number of repeated program loops may be reduced, program time and verification time may be reduced, and data may be effectively stored. In addition, the read voltage may be set based on the final verification level of the verification voltage, and thus, the nonvolatile memory device may effectively perform the read operation.

Figure 18:
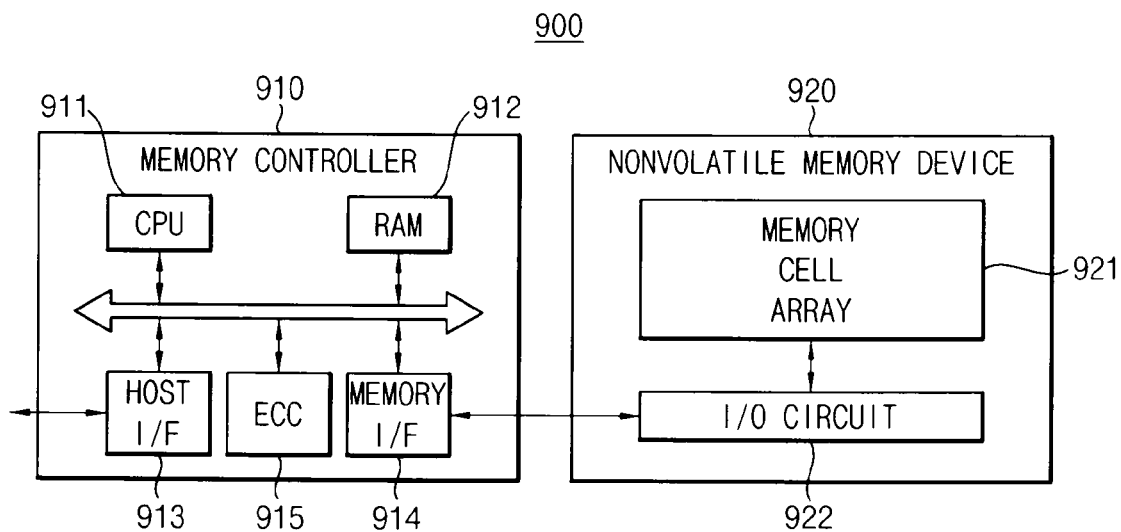
FIG. 18 is a block diagram illustrating a memory system according to example embodiments.

FIG. 18 is a block diagram illustrating a memory system according to example embodiments.

Referring to FIG. 18, a memory system 900 includes a memory controller 910 and a nonvolatile memory device 920.

The nonvolatile memory device 920 includes a memory cell array 921 and an I/O circuit 922. The I/O circuit 922 may include page buffers that are coupled to bitlines, and may store data to be written in the memory cell array 921 or data read out from the memory cell array 921. The memory cell array 921 may include memory cells coupled to wordlines and the bitlines. The nonvolatile memory device 920 may perform a program operation on the memory cells, and may perform a verification operation on the memory cells based on a verification voltage that is changed depending on the program operation. Thus, in the nonvolatile memory device 920, program time and verification time may be reduced, and data may be effectively stored in the memory cells.

The memory controller 910 may control the nonvolatile memory device 920. The memory controller 910 may control data transfer between an external host (not illustrated) and the nonvolatile memory device 920. The memory controller 910 may include a central processing unit 911, a buffer memory 912, a host interface 913 and a memory interface 914. The central processing unit 911 may perform operations for the data transfer. The buffer memory 912 may be implemented by a dynamic random access memory (DRAM), a static random access memory (SRAM), a PRAM, a FRAM, a RRAM, a MRAM, and so on. According to example embodiments, the buffer memory 912 may be located inside or outside the memory controller 910.

The host interface 913 may be coupled to the host, and the memory interface 914 may be coupled to the nonvolatile memory device 920. The central processing unit 911 may communicate with the host via the host interface 913. For example, the host interface 913 may be configured to communicate with the host using at least one of various interface protocols, such as a universal serial bus (USB), a multimedia card (MMC), a peripheral component interconnect-express (PCI-E), a small computer system interface (SCSI), a serial-attached SCSI (SAS), a serial advanced technology attachment (SATA), a parallel advanced technology attachment (PATA), an enhanced small disk interface (ESDI), integrated drive electronics (IDE), and so on. Further, the central processing unit 911 may communicate with the nonvolatile memory device 920 via the memory interface 914. In some example embodiments, the memory controller 910 may further include an error correction block 915 for error correction. According to example embodiments, the memory controller 910 may be built in the nonvolatile memory device 920, or the memory controller 910 and the nonvolatile memory device 920 may be implemented as separate chips.

The memory system 900 may be implemented as a memory card, a solid state drive, and so on. In some embodiments, the nonvolatile memory device 920, the memory controller 910 and/or the memory system 900 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

Figure 19:
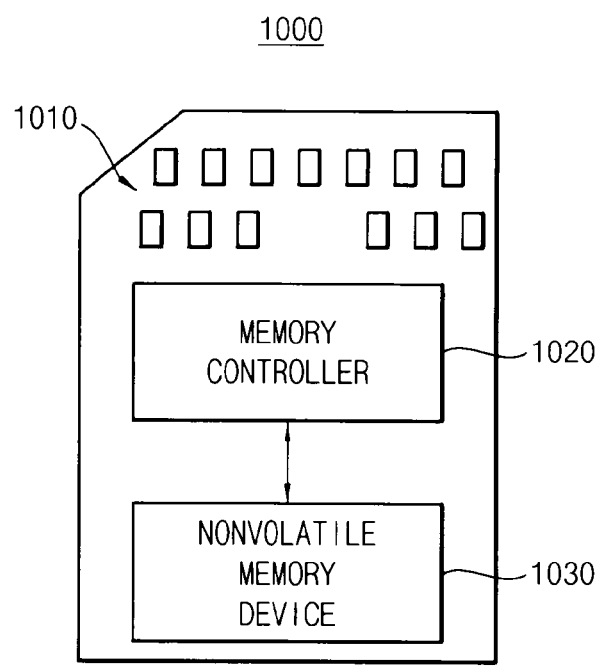
FIG. 19 is a diagram illustrating a memory card including a memory system according to example embodiments.

FIG. 19 is a diagram illustrating a memory card including a memory system according to example embodiments.

Referring to FIG. 19, a memory card 1000 may include a plurality of connecting pins 1010, a memory controller 1020 and a nonvolatile memory device 1030.

The connecting pins 1010 may be coupled to a host (not illustrated) to transfer signals between the host and the memory card 1000. The connecting pins 1010 may include a clock pin, a command pin, a data pin and/or a reset pin.

The memory controller 1020 may receive data from the host, and may store the received data in the nonvolatile memory device 1030.

The nonvolatile memory device 1030 may include memory cells, may perform a program operation on the memory cells, and may perform a verification operation on the memory cells based on a verification voltage that is changed depending on the program operation. Thus, in the nonvolatile memory device 1030, program time and verification time may be reduced, and data may be effectively stored in the memory cells.

For example, the memory card 1000 may include a MMC, an embedded MMC (eMMC), a hybrid embedded MMC (hybrid eMMC), a secure digital (SD) card, a micro-SD card, a memory stick, an ID card, a personal computer memory card international association (PCMCIA) card, a chip card, a USB card, a smart card, a compact flash (CF) card, and so on.

In some embodiments, the memory card 1000 may be coupled to the host, such as a desktop computer, a laptop computer, a tablet computer, a mobile phone, a smart phone, a music player, a personal digital assistants (PDA), a portable multimedia player (PMP), a digital television, a digital camera, a portable game console, and so on.

Figure 20:
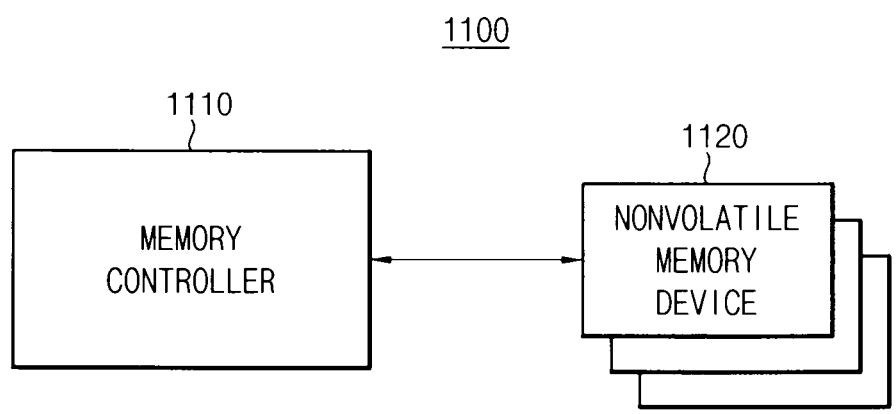
FIG. 20 is a diagram illustrating a solid state drive including a memory system according to example embodiments.

FIG. 20 is a diagram illustrating a solid state drive including a memory system according to example embodiments.

Referring to FIG. 20, a solid state drive (SSD) 1100 includes a memory controller 1110 and a plurality of nonvolatile memory devices 1120.

The memory controller 1110 may receive data from a host (not illustrated). The memory controller 1110 may store the received data in the plurality of nonvolatile memory devices 1120.

The nonvolatile memory device 1120 may include memory cells, may perform a program operation on the memory cells, and may perform a verification operation on the memory cells based on a verification voltage that is changed depending on the program operation. Thus, in the nonvolatile memory device 1120, program time and verification time may be reduced, and data may be effectively stored in the memory cells.

In some embodiments, the solid state drive 1100 may be coupled to the host, such as a mobile device, a mobile phone, a smart phone, a PDA, a PMP, a digital camera, a portable game console, a music player, a desktop computer, a notebook computer, a tablet computer, a speaker, a video, a digital television, and so on.

Figure 21:
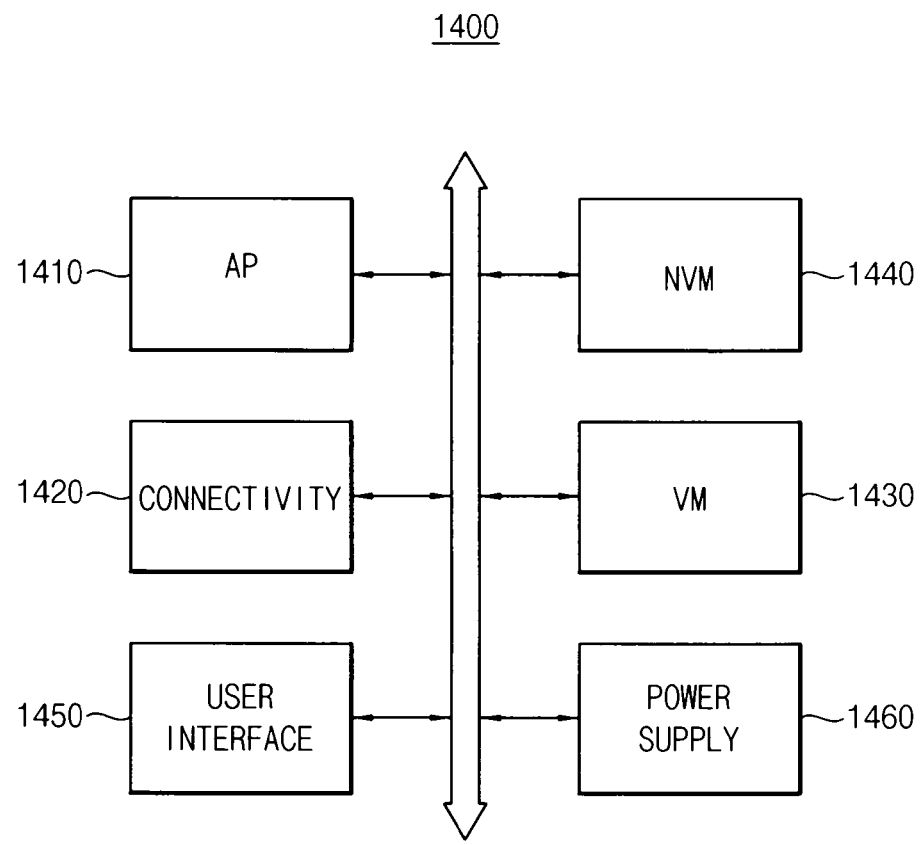
FIG. 21 is a diagram illustrating a mobile system according to example embodiments.

FIG. 21 is a diagram illustrating a mobile system according to example embodiments.

Referring to FIG. 21, a mobile system 1400 includes an application processor 1410, a connectivity unit 1420, a volatile memory device 1430, a nonvolatile memory device 1440, a user interface 1450 and a power supply 1460. According to example embodiments, the mobile system 1400 may be any mobile system, such as a mobile phone, a smart phone, a tablet computer, a laptop computer, a PDA, a PMP, a digital camera, a portable game console, a music player, a camcorder, a video player, a navigation system, and so on.

The application processor 1410 may execute applications, such as an internet browser, a game application, a video player application, and so on. According to example embodiments, the application processor 1410 may include a single processor core or a plurality of processor cores. For example, the application processor 1410 may be a multi-core processor, such as a dual-core processor, a quad-core processor, a hexa-core processor, and so on. In some example embodiments, the application processor 1410 may further include a cache memory located inside or outside the application processor 1410.

The connectivity unit 1420 may perform wired or wireless communication with an external device. For example, the connectivity unit 1420 may perform a USB communication, an Ethernet communication, a near field communication (NFC), a radio frequency identification (RFID) communication, a mobile telecommunication, a memory card communication, wireless internet, wireless fidelity (Wi-Fi), global positioning system (GPS), Bluetooth (BT), global system for mobile communication (GSM), general packet radio system (GPRS), wideband code division multiple access (WCDMA), high speed uplink/downlink packet access (HSxPA), and so on. The connectivity unit 1420 may include a baseband chipset.

The volatile memory device 1430 may store an instruction/data processed by the application processor 1410, or may serve as a working memory. For example, the volatile memory device 1430 may be implemented by a DRAM, a SRAM, a mobile DRAM, or the like.

The nonvolatile memory device 1440 may store a boot image for booting the mobile system 1400. For example, the nonvolatile memory device 1440 may be implemented by an electrically erasable programmable read-only memory (EEPROM), a flash memory, a PRAM, a RRAM, a MRAM, a FRAM, a nano floating gate memory (NFGM), a polymer random access memory (PoRAM), or the like. The nonvolatile memory device 1440 may include memory cells, may perform a program operation on the memory cells, and may perform a verification operation on the memory cells based on a verification voltage that is changed depending on the program operation. Thus, in the nonvolatile memory device 1440, program time and verification time may be reduced, and data may be effectively stored in the memory cells.

The user interface 1450 may include at least one input device, such as a keypad, a touch screen, and so on., and at least one output device, such as a display device, a speaker, and so on. The power supply 1460 may supply the mobile system 1400 with power. In some example embodiments, the mobile system 1400 may further include a camera image processor (CIS), storage device, such as a memory card, a SDD, a CD-ROM, and so on.

According to example embodiments, the mobile system 1400 and/or components of the mobile system 1400 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

Figure 22:
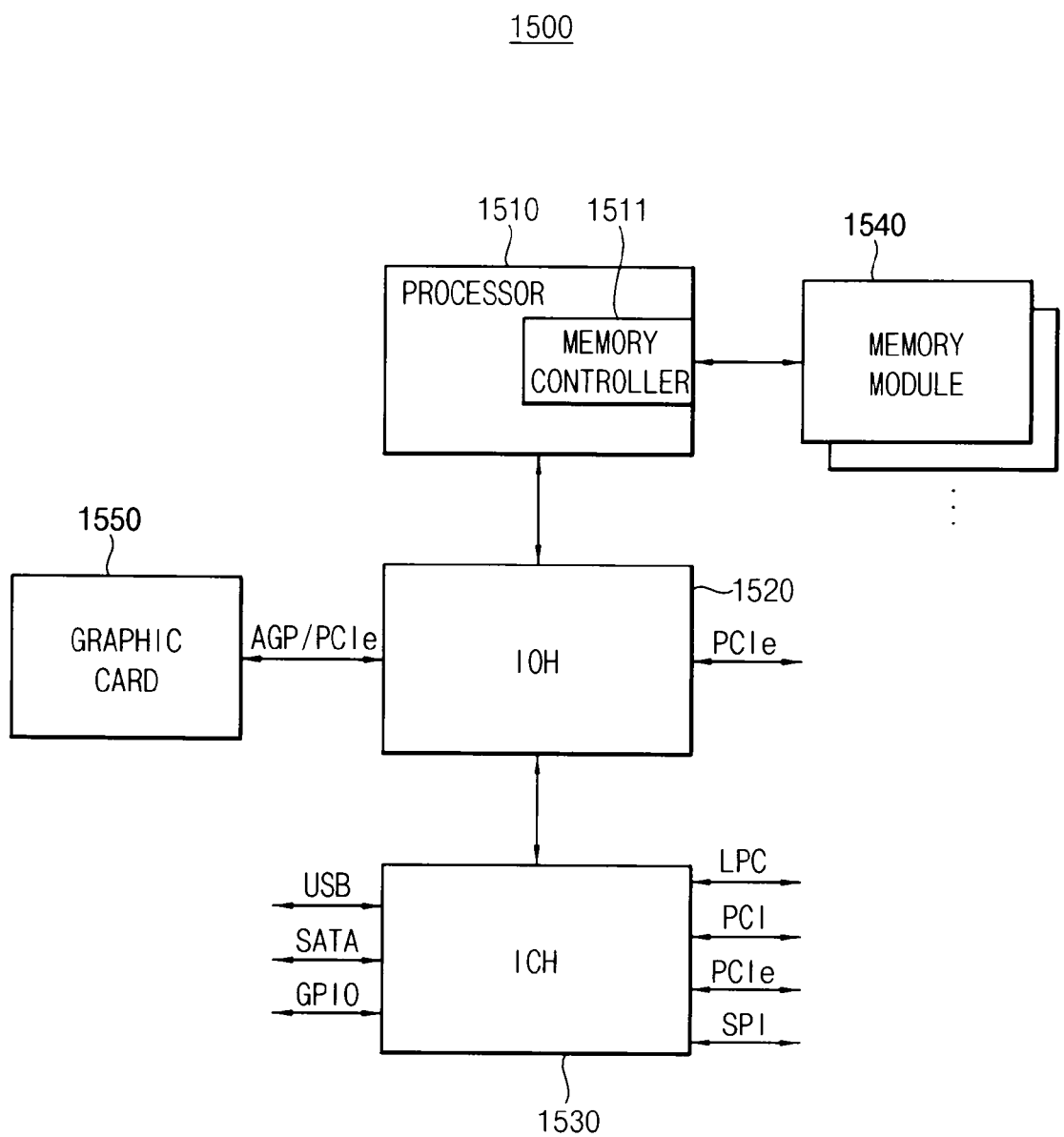
FIG. 22 is a diagram illustrating a computing system according to example embodiments.

FIG. 22 is a diagram illustrating a computing system according to example embodiments.

Referring to FIG. 22, a computing system 1500 includes a processor 1510, an I/O hub 1520, an I/O controller hub 1530, at least one memory module 1540 and a graphic card 1550. According to example embodiments, the computing system 1500 may be any computing system, such as a personal computer (PC), a server computer, a workstation, a tablet computer, a laptop computer, a mobile phone, a smart phone, a PDA, a PMP, a digital camera, a digital television, a set-top box, a music player, a portable game console, a navigation device, and so on.

The processor 1510 may perform specific calculations or tasks. For example, the processor 1510 may be a microprocessor, a central process unit (CPU), a digital signal processor, or the like. According to example embodiments, the processor 1510 may include a single processor core or a plurality of processor cores. For example, the processor 1510 may be a multi-core processor, such as a dual-core processor, a quad-core processor, a hexa-core processor, and so on. Although FIG. 22 illustrates an example of the computing system 1500 including one processor 1510, according to example embodiments, the computing system 1500 may include a plurality of processors. In some example embodiments, the processor 1510 may further include a cache memory located internally or externally the processor 1510.

The processor 1510 may include a memory controller (not illustrated) that controls an operation of the memory module 1540. The memory controller included in the processor 1510 may be referred to as an integrated memory controller (IMC). A memory interface between the memory controller and the memory module 1540 may be implemented by one channel including a plurality of signal lines, or by a plurality of channels. Each channel may be coupled to at least one memory module 1540. In some example embodiments, the memory controller may be included in the I/O hub 1520. The I/O hub 1520 including the memory controller may be referred to as a memory controller hub (MCH).

The memory module 1540 may include a plurality of nonvolatile memory devices that store data provided from the memory controller 1511. The nonvolatile memory devices may include memory cells, may perform a program operation on the memory cells, and may perform a verification operation on the memory cells based on a verification voltage that is changed depending on the program operation. Thus, in the nonvolatile memory devices, program time and verification time may be reduced, and data may be effectively stored in the memory cells.

The I/O hub 1520 may manage data transfer between the processor 1510 and devices, such as the graphic card 1550. The I/O hub 1520 may be coupled to the processor 1510 via at least one of various interfaces, such as a front side bus (FSB), a system bus, a HyperTransport, a lightning data transport (LDT), a QuickPath interconnect (QPI), a common system interface (CSI), and so on. Although FIG. 22 illustrates an example of the computing system 1500 including one I/O hub 1520, according to example embodiments, the computing system 1500 may include a plurality of I/O hubs.

The I/O hub 1520 may provide various interfaces with the devices. For example, the I/O hub 1520 may provide an accelerated graphics port (AGP) interface, a peripheral component interface-express (PCIe), a communications streaming architecture (CSA) interface, and so on.

The graphic card 1550 may be coupled to the I/O hub 1520 via the AGP or the PCIe. The graphic card 1550 may control a display device (not illustrated) for displaying an image. The graphic card 1550 may include an internal processor and an internal memory to process the image. In some example embodiments, the input/output hub 1520 may include an internal graphic device along with or instead of the graphic card 1550. The internal graphic device may be referred to as an integrated graphics, and an I/O hub including the memory controller and the internal graphic device may be referred to as a graphics and memory controller hub (GMCH).

The I/O controller hub 1530 may perform data buffering and interface arbitration to efficiently operate various system interfaces. The I/O controller hub 1530 may be coupled to the I/O hub 1520 via an internal bus. For example, the I/O controller hub 1530 may be coupled to the I/O hub 1520 via at least one of various interfaces, such as a direct media interface (DMI), a hub interface, an enterprise Southbridge interface (ESI), PCIe, and so on.

The I/O controller hub 1530 may provide various interfaces with peripheral devices. For example, the I/O controller hub 1530 may provide a universal serial bus (USB) port, a serial advanced technology attachment (SATA) port, a general purpose input/output (GPIO), a low pin count (LPC) bus, a serial peripheral interface (SPI), a PCI, a PCIe, and so on.

In some example embodiments, the processor 1510, the I/O hub 1520 and the I/O controller hub 1530 may be implemented as separate chipsets or separate integrated circuits. In other embodiments, at least two of the processor 1510, the I/O hub 1520 and the I/O controller hub 1530 may be implemented in combination as one chipset.

The above described embodiments may be used in any device or system including a nonvolatile memory device, such as a mobile phone, a smart phone, a PDA, a PMP, a digital camera, a digital television, a set-top box, a music player, a portable game console, a navigation device, a PC, a server computer, a workstation, a tablet computer, a laptop computer, a smart card, a printer, and so on.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of storing data in a nonvolatile memory device, the method comprising:
    performing in succession a plurality of program loops which each include a program operation followed by a verification operation, each program operation including applying a program voltage to a same set of target memory cells among a plurality of memory cells, and each; a verification operation including applying a verification voltage to the same set of target memory cells to determine whether all of the target memory cells are completely programmed;
    wherein, for each program loop in which it is determined that less than all the target memory cells are completely programmed, the method further comprises adjusting the verification voltage to be used in the verification operation of a next program loop,
    wherein, for any program loop in which it is determined that all the target memory cells are completely programmed, the method further comprising terminating the performing of the plurality of program loops, and
wherein adjusting the verification voltage includes decreasing a level of the verification voltage.

2. The method of claim 1, wherein the verification voltage is decreased by a same step down level subsequent to each program loop in which it is determined that less than all the target memory cells are completely programmed.

3. The method of claim 1, wherein the verification voltage is decreased by a same step down level, until the verification voltage reaches a reference level, subsequent to each program loop in which it is determined that less than all the target memory cells are completely programmed.

4. The method of claim 1, wherein the performing the verification operation includes:
applying the verification voltage to a wordline connected to the target memory cells;
generating a verification result by comparing threshold voltages of the target memory cells with the verification voltage; and
determining whether each target memory cell corresponds to a failed program state or a normal program state based on the verification result;
wherein it is determined that less than all the target memory cells are completely programmed when it is determined that at least one of the target memory cells corresponds to the failed program state.

5. The method of claim 4, wherein the performing the verification operation further includes:
selectively applying a bulk voltage to a bulk substrate of the nonvolatile memory device including the target memory cells.

6. The method of claim 5, wherein the bulk voltage is a negative voltage.

7. The method of claim 1, further comprising:
performing a pre-program operation on the target memory cells; and
performing an erase operation on the target memory cells after the pre-program operation,
wherein the plurality of program loops constitute a post-program operation that is performed after the erase operation.

8. The method of claim 1, wherein the nonvolatile memory device is a vertical memory device having a stacked structure.

9. The method of claim 1, wherein the plurality of memory cells include single-level memory cells or multi-level memory cells, each single-level memory cell storing a single data bit, each multi-level memory cell storing a plurality of data bits.

10. A method of operating a nonvolatile memory device, the method comprising:
performing in succession a plurality of program loops which each include a program operation and a verification operation, each program operation including applying a program voltage to a same set of target memory cells among a plurality of memory cells, and each verification operation including applying a verification voltage to the same set of target memory cells to determine whether all of the target memory cells are completely programmed;
wherein, for each program loop in which it is determined that less than all the target memory cells are completely programmed, the method further comprises adjusting the verification voltage to be used in the verification operation of a next program loop,
wherein, for any program loop in which it is determined that all the target memory cells are completely programmed, the method further comprising terminating the performing of the plurality of program loops and providing a final verification level of the verification voltage to an external control circuit and wherein adjusting the verification voltage includes reducing the verification voltage by a step down level.

11. The method of claim 10, further comprising:
setting a read voltage based on the final verification level of the verification voltage; and
performing a read operation on the target memory cells based on the read voltage.

12. The method of claim 10, wherein the step down level is the same for each program loop.

13. The method of claim 10, wherein the step down level is variable for each program loop.

14. The method of claim 10, wherein each verification operation includes:
applying the verification voltage to a wordline connected to the target memory cells;
generating verification result by comparing threshold voltages of the target memory cells with the verification voltage;
determining whether each target memory cell corresponds to the pass condition or the fail condition based on the verification result.

* * * * *